(12) United States Patent
Miyanami

(10) Patent No.: US 9,502,459 B2
(45) Date of Patent: Nov. 22, 2016

(54) IMAGE PICKUP DEVICE, METHOD OF MANUFACTURING IMAGE PICKUP DEVICE, AND ELECTRONIC APPARATUS

(71) Applicant: Sony Corporation, Tokyo (JP)

(72) Inventor: Yuki Miyanami, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 167 days.

(21) Appl. No.: 14/313,462

(22) Filed: Jun. 24, 2014

(65) Prior Publication Data

US 2015/0001376 A1 Jan. 1, 2015

(30) Foreign Application Priority Data

Jul. 1, 2013 (JP) .................................. 2013-138264

(51) Int. Cl.
*H01L 27/146* (2006.01)

(52) U.S. Cl.
CPC ..... *H01L 27/14643* (2013.01); *H01L 27/1461* (2013.01); *H01L 27/1463* (2013.01); *H01L 27/1464* (2013.01); *H01L 27/14603* (2013.01); *H01L 27/14614* (2013.01); *H01L 27/14627* (2013.01); *H01L 27/14638* (2013.01); *H01L 27/14641* (2013.01); *H01L 27/14685* (2013.01); *H01L 27/14689* (2013.01)

(58) Field of Classification Search
CPC .............. H01L 27/14603; H01L 27/1461; H01L 27/14614; H01L 27/14627; H01L 27/1463; H01L 27/14638; H01L 27/1464; H01L 27/14641; H01L 27/14643; H01L 27/14685; H01L 27/14689

See application file for complete search history.

(56) References Cited

U.S. PATENT DOCUMENTS

2009/0303371 A1* 12/2009 Watanabe ......... H01L 27/14603
348/311

FOREIGN PATENT DOCUMENTS

| JP | 2007-115994 A | 5/2007 |
| JP | 2010-147965 A | 7/2010 |
| JP | 2010-212288 A | 9/2010 |
| JP | 2011-049446 A | 3/2011 |

* cited by examiner

*Primary Examiner* — Francis M Legasse, Jr.
(74) *Attorney, Agent, or Firm* — Sheridan Ross P.C.

(57) ABSTRACT

An image pickup device includes: a photodiode provided in a silicon substrate, and configured to generate electric charge corresponding to an amount of received light, by performing photoelectric conversion; and a transfer transistor provided at an epitaxial layer on the silicon substrate, and configured to transfer the electric charge generated in the photodiode, wherein the transfer transistor includes a gate electrode and a channel region, the gate electrode being embedded in the epitaxial layer, and the channel region surrounding the gate electrode, and the channel region has, in a thickness direction, a concentration gradient in which a curvature of a potential gradient is free from a mixture of plus and minus signs.

7 Claims, 32 Drawing Sheets

IMAGE PICKUP DEVICE, METHOD OF MANUFACTURING IMAGE PICKUP DEVICE, AND ELECTRONIC APPARATUS

CROSS REFERENCE TO RELATED APPLICATIONS

This application claims the benefit of Japanese Priority Patent Application JP2013-138264 filed Jul. 1, 2013, the entire contents of which are incorporated herein by reference.

BACKGROUND

The present technology relates to an image pickup device, a method of manufacturing the image pickup device, and an electronic apparatus.

In an electronic apparatus with an image pickup function such as a digital still camera and a digital video camera, a solid-state image pickup device such as a charge coupled device (CCD) and a complementary metal oxide semiconductor (CMOS) image sensor is typically used.

In general, in the CMOS image sensor, a pixel-sharing technique is often adopted to maximize a photodiode aperture ratio, to go with a finer pixel size. In this pixel-sharing technique, an area occupied by elements except the photodiode in a pixel section is minimized by sharing a transistor between a plurality of pixels, so that the area of the photodiode is secured. For example, characteristics such as a saturated charge amount and sensitivity of the photodiode may be improved by utilizing the pixel-sharing technique.

For example, Japanese Unexamined Patent Application Publication Nos. 2010-147965, 2010-212288, 2007-115994, and 2011-049446 may disclose layouts of various pixel sections in CMOS image sensors to which a pixel-sharing technique is applied.

SUMMARY

Meanwhile, in a typical CMOS image sensor, a photodiode and a transistor necessary to drive a pixel are formed on the same plane, and it is necessary to ensure minimum characteristics of each of the photodiode and the transistor. Therefore, there is a limitation in terms of area. For example, when the area of the photodiode is expanded to improve characteristics including a saturated charge amount and sensitivity of the photodiode, the region of the transistor is reduced accordingly. As a result, random noise attributable to the transistor increases, or a gain of a circuit decreases. On the other hand, when the area of the transistor is secured, characteristics including a saturated charge amount and sensitivity of the photodiode deteriorate. Therefore, it is desired to improve the characteristics including the saturated charge amount and the sensitivity of the photodiode, without reducing the area of the transistor.

It is desirable to provide an image pickup device capable of further improving characteristics including a saturation charge amount and sensitivity, and to provide a method of manufacturing the image pickup device, and an electronic apparatus.

According to an embodiment of the present disclosure, there is provided an image pickup device including: a photodiode provided in a silicon substrate, and configured to generate electric charge corresponding to an amount of received light, by performing photoelectric conversion; and a transfer transistor provided at an epitaxial layer on the silicon substrate, and configured to transfer the electric charge generated in the photodiode, wherein the transfer transistor includes a gate electrode and a channel region, the gate electrode being embedded in the epitaxial layer, and the channel region surrounding the gate electrode, and the channel region has, in a thickness direction, a concentration gradient in which a curvature of a potential gradient is free from a mixture of plus and minus signs.

According to an embodiment of the present disclosure, there is provided an electronic apparatus including: an image pickup device; and a signal processing circuit configured to perform predetermined processing on a pixel signal outputted from the image pickup device, wherein the image pickup device includes a photodiode provided in a silicon substrate, and configured to generate electric charge corresponding to an amount of received light, by performing photoelectric conversion, and a transfer transistor provided at an epitaxial layer on the silicon substrate, and configured to transfer the electric charge generated in the photodiode, the transfer transistor includes a gate electrode and a channel region, the gate electrode being embedded in the epitaxial layer, and the channel region surrounding the gate electrode, and the channel region has, in a thickness direction, a concentration gradient in which a curvature of a potential gradient is free from a mixture of plus and minus signs.

In the image pickup device and the electronic apparatus according to the above-described embodiments of the present technology, the photodiode and the transfer transistor are provided in different layers. This eliminates a limitation in terms of an area necessary to secure minimum characteristics of the photodiode and the transfer transistor. Further, the channel region has, in the thickness direction, the concentration gradient in which the curvature of the potential gradient is free from the mixture of plus and minus signs. This suppresses electric charge accumulation in the channel region, thereby improving transfer characteristics of the electric charge in the transfer transistor. As a result, a potential of the photodiode is allowed to be deepened.

According to an embodiment of the present disclosure, there is provided a method of manufacturing an image pickup device. The method includes the following two procedures.

(A) Forming an epitaxial layer on a top surface of a silicon substrate by performing In-Situ Dope epitaxial growth, the epitaxial layer having concentration distribution in which a curvature of a concentration gradient in a thickness direction is free from a mixture of plus and minus signs, and the silicon substrate including a photodiode that is configured to generate electric charge corresponding to an amount of received light, by performing photoelectric conversion.

(B) Forming a channel region in a part of the epitaxial layer by inverting a part of the epitaxial layer, the channel region having, in a thickness direction, a concentration gradient in which a curvature of a potential gradient is free from a mixture of plus and minus signs, and the part being immediately above the photodiode.

In the method of manufacturing the image pickup device according to the above-described embodiment of the present technology, the epitaxial layer including the channel region used for a transfer transistor is formed on the top surface of the silicon substrate in which the photodiode is formed. This eliminates a limitation in terms of an area necessary to secure minimum characteristics of the photodiode and the transfer transistor. Further, the channel region has, in the thickness direction, the concentration gradient in which the curvature of the potential gradient is free from the mixture of plus and minus signs. This suppresses electric charge accumulation in the channel region, thereby improving transfer characteristics of the electric charge in the transfer transistor. As a result, a potential of the photodiode is allowed to be deepened.

According to the image pickup device, the method of manufacturing the image pickup device, and the electronic apparatus of the above-described embodiments of the present technology, there is no limitation in terms of the area necessary to secure the minimum characteristics of the photodiode and the transfer transistor. Further, the potential of the photodiode is allowed to be deepened. Therefore, further improvements in characteristics including a saturation charge amount and sensitivity are allowed.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the present disclosure, and are incorporated in and constitute a part of this specification. The drawings illustrate embodiments and, together with the specification, serve to describe the principles of the technology.

DETAILED DESCRIPTION

Some embodiments of the present technology will be described below with reference to the drawings. It is to be noted that the description will be provided in the following order.

1. First embodiment (an image pickup device)
   An example in which a channel region has an n-type concentration profile
2. Second embodiment (an image pickup device)
   An example in which an organic photoelectric conversion film is provided
3. First modification (an image pickup device)
   An example in which a gate electrode extends to a PD
4. Second modification (an image pickup device)

An example in which a channel region has a p-type concentration profile

5. Third modification (an image pickup device)
An example in which an element separation section is provided
6. Third embodiment (an image pickup module)
7. Fourth embodiment (an electronic apparatus)

1. First Embodiment

[Configuration]

Figure 1:
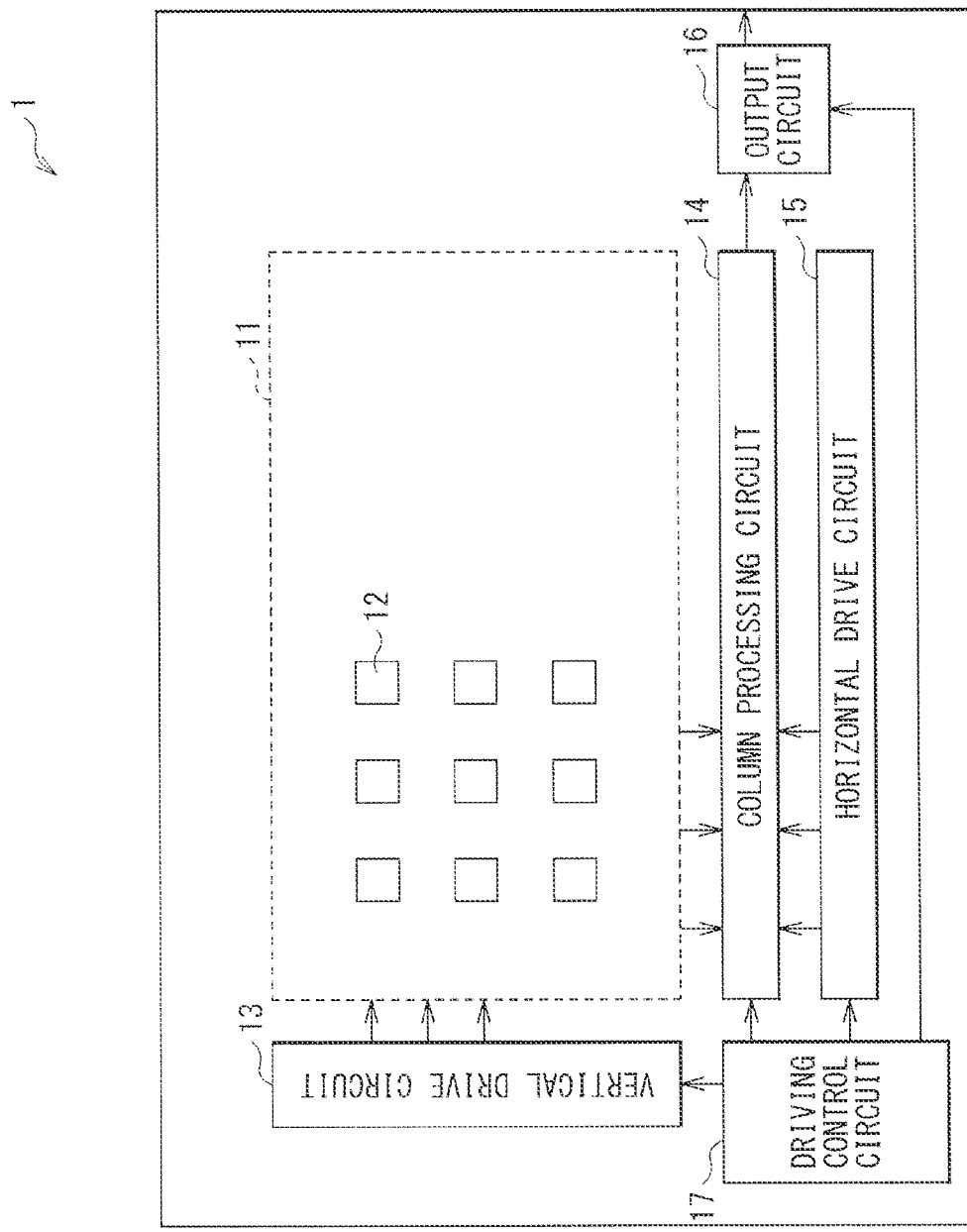
FIG. 1 is a diagram illustrating an example of a schematic configuration of an image pickup device according to a first embodiment of the present technology.

FIG. 1 illustrates an example of a schematic configuration of an image pickup device 1 according to a first embodiment of the present technology. The image pickup device 1 is a CMOS-type solid-state image pickup device. The image pickup device 1 includes a pixel region 11 and peripheral circuits. In the pixel region 11, a plurality of pixels 12 are arranged in rows and columns. As the peripheral circuits, the image pickup device 1 may include, for example, a vertical drive circuit 13, a column processing circuit 14, a horizontal drive circuit 15, an output circuit 16, and a driving control circuit 17.

The vertical drive circuit 13 may be, for example, a circuit that sequentially selects the plurality of pixels 12 row by row. The column processing circuit 14 may be, for example, a circuit that performs correlated double sampling (CDS) processing, on a pixel signal outputted from each of the pixels 12 in the row selected by the vertical drive circuit 13. For example, the column processing circuit 14 may extract a signal level of the pixel signal and hold pixel data corresponding to an amount of received light of each of the pixels 12, by performing the CDS processing. The horizontal drive circuit 15 may be, for example, a circuit that sequentially outputs the pixel data held by the column processing circuit 14, to the output circuit 16. The output circuit 16 may be, for example, a circuit that amplifies the inputted pixel data, and outputs the amplified pixel data to an external signal processing circuit. The driving control circuit 17 may be, for example, a circuit that controls driving of each block (the vertical drive circuit 13, the column processing circuit 14, the horizontal drive circuit 15, and the output circuit 16) among the peripheral circuits.

Figure 2:
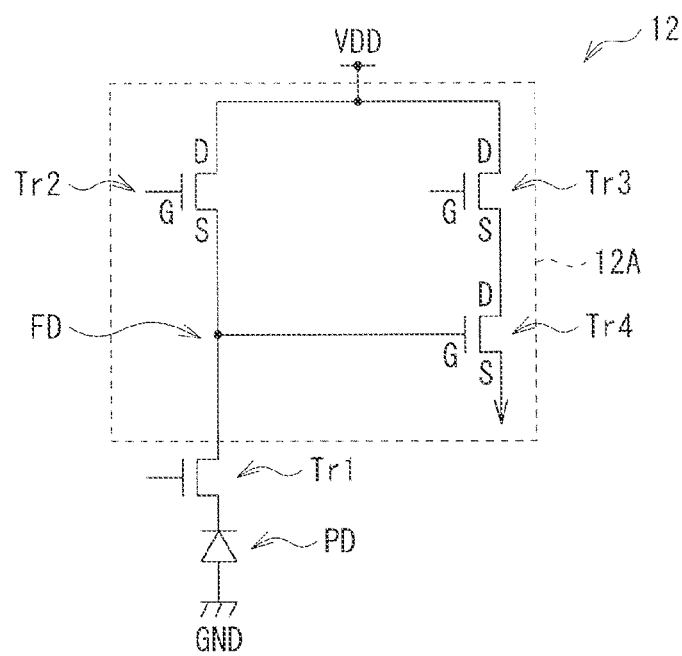
FIG. 2 is a diagram illustrating an example of a circuit configuration of a pixel in FIG. 1.

FIG. 2 illustrates an example of a circuit configuration of the pixel 12. For example, the pixel 12 may include a photodiode PD, and a transfer transistor Tr1, and a readout circuit 12A. The photodiode PD generates electric charge corresponding to the amount of received light, by performing photoelectric conversion. The photodiode PD is configured using an inorganic material. It is to be noted that the readout circuit 12A may be provided for each of the pixels 12, or may be shared by the plurality of pixels 12. The readout circuit 12A may include, for example, a floating diffusion section FD, a reset transistor Tr2, a select transistor Tr3, and an amplifying transistor Tr4. The floating diffusion section FD stores the electric charge generated in the photodiode PD. The transfer transistor Tr1, the reset transistor Tr2, the select transistor Tr3, and the amplifying transistor Tr4 are CMOS transistors.

A cathode of the photodiode PD is connected to a source of the transfer transistor Tr1, and an anode of the photodiode PD is connected to a reference potential line (for example, ground). A drain of the transfer transistor Tr1 is connected to the floating diffusion section FD, and a gate of the transfer transistor Tr1 is connected to the vertical drive circuit 13. A source of the reset transistor Tr2 is connected to the floating diffusion section FD, and a drain of the reset transistor Tr2 is connected to a drain of a power supply line VDD and the select transistor Tr3. A gate of the reset transistor Tr2 is connected to the vertical drive circuit 13. A source of the select transistor Tr3 is connected to a drain of the amplifying transistor Tr4, and a gate of the select transistor Tr3 is connected to the vertical drive circuit 13. A source of the amplifying transistor Tr4 is connected to the column processing circuit 14, and a gate of the amplifying transistor Tr4 is connected to the floating diffusion section FD.

When the reset transistor Tr2 changes to an ON state, the reset transistor Tr2 resets an electric potential of the floating diffusion section FD to an electric potential of the power supply line VDD. The select transistor Tr3 controls timing of outputting a pixel signal from the readout circuit 12A. The amplifying transistor Tr4 forms a source-follower-type amplifier, and outputs a pixel signal of a voltage corresponding to the level of the electric charge generated in the photodiode PD. When the select transistor Tr3 changes to an ON state, the amplifying transistor Tr4 amplifies the electric potential of the floating diffusion section FD, and outputs a voltage corresponding to the amplified electric potential, to the column processing circuit 14.

Figure 3:
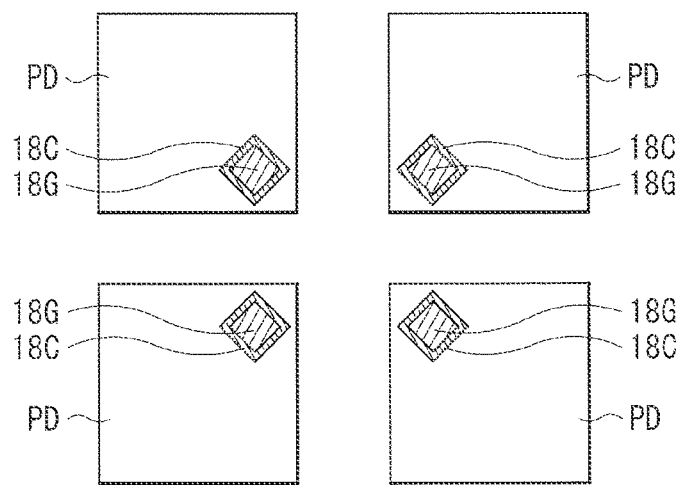
FIG. 3 is a diagram illustrating an example of an in-plane layout of the pixel in FIG. 1.
Figure 4:
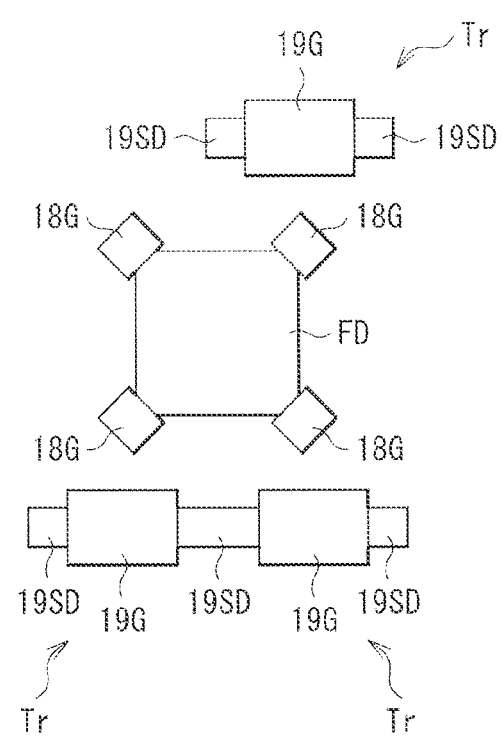
FIG. 4 is a diagram illustrating another example of the in-plane layout of the pixel in FIG. 1.
Figure 5:
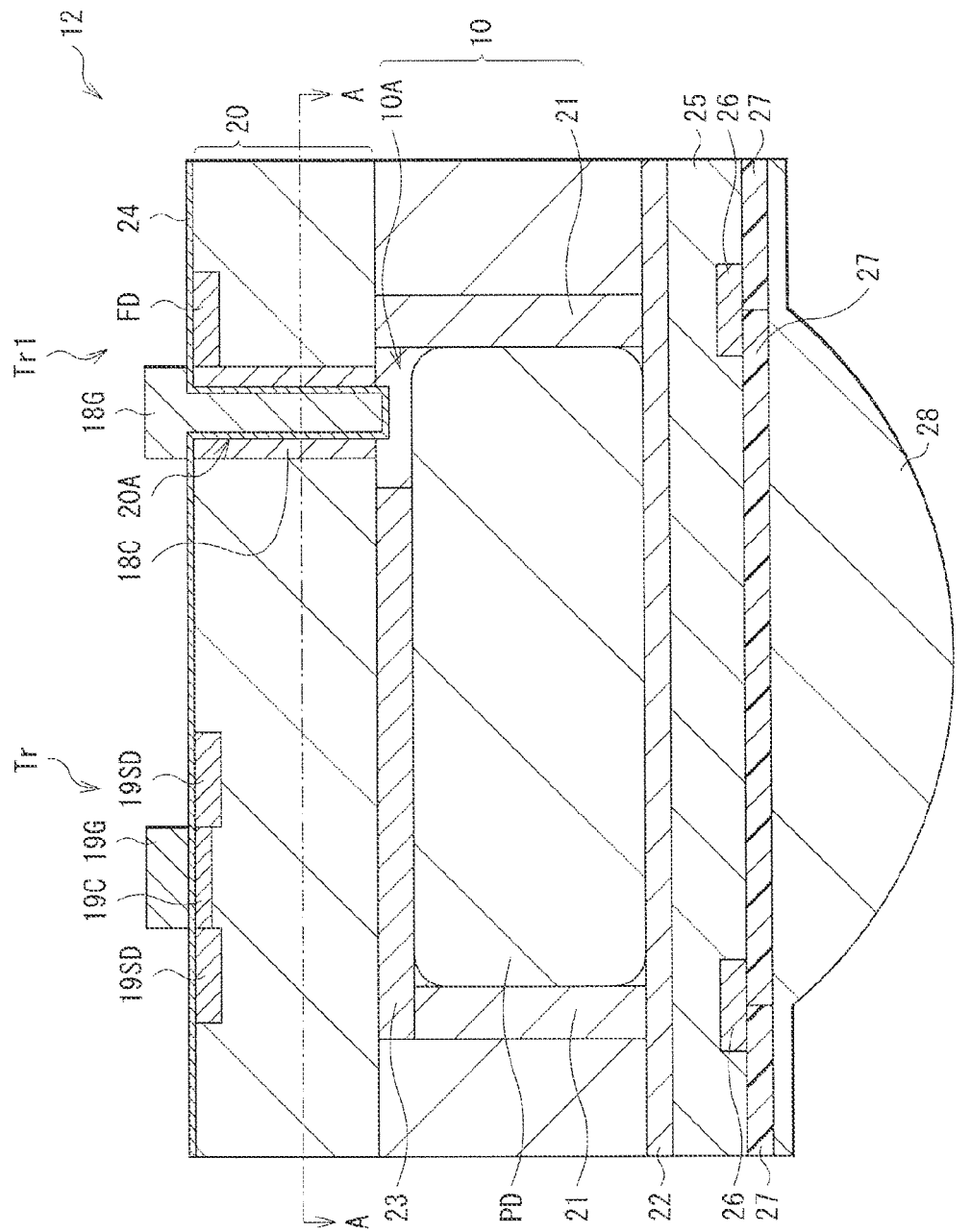
FIG. 5 is a diagram illustrating an example of a cross-sectional configuration of the pixel in FIG. 1.

FIGS. 3 and 4 each illustrate an example of an in-plane layout of the pixel 12. FIG. 5 illustrates an example of a cross-sectional configuration of a part of the pixel 12. FIG. 3 illustrates an example of a section layout taken along a line A-A of FIG. 5, and FIG. 4 illustrates an example of a top-surface layout of the part of the pixel 12 illustrated in FIG. 5. In FIG. 3, an epitaxial layer 20 to be described later is omitted.

In the example of the in-plane layout of the pixel 12 illustrated in each of FIGS. 3 and 4, the readout circuit 12A is shared by the four pixels 12. In this case, the four pixels 12 have four-fold rotational symmetry in the in-plane layout of FIG. 3. Assume that one of the four pixels 12 in FIG. 3 is a pixel of interest. Then, a layout of the remaining three pixels 12 when viewed from the pixel of interest is identical to that when any one of the remaining three pixels 12 among the four pixels 12 in FIG. 3 is a pixel of interest. The in-plane layout of the pixel 12 is not limited to those illustrated in FIGS. 3 and 4. The in-plane layout of the shared four pixels 12 is not limited to those illustrated in FIGS. 3 and 4 either.

The image pickup device 1 includes, in the pixel region 11, a silicon substrate 10, and the epitaxial layer 20 formed on one surface (the surface) of the silicon substrate 10. The image pickup device 1 further includes, in the pixel region 11, an antireflection film 25, a light-shielding film 26, a color filter 27, and an on-chip lens 28, on the other surface (a back surface) of the silicon substrate 10.

The silicon substrate 10 is an n-type silicon substrate. This n-type silicon substrate has an n-type impurity concentration, which is lower than an n-type impurity concentration in an n-type region of the photodiode PD. This n-type silicon substrate has n-type impurity concentration distribution, which is uniform while having almost no concentration gradient of an n-type impurity in a thickness direction. The epitaxial layer 20 is a layer formed on the silicon substrate 10 by causing crystal growth of silicon. The epitaxial layer 20 is a silicon layer of a conductivity type (a p-type) different from a conductivity type of the silicon substrate 10. This p-type silicon layer is an inversion layer formed by forming a silicon epitaxial layer of an n-type through In-Situ Dope epitaxial growth, and inverting the conductivity type from the n-type to the p-type by implanting a p-type impurity. "In-Situ Dope" refers to doping during epitaxial growth.

The on-chip lens 28 concentrates incident light on the photodiode PD, for each of the pixels 12. The color filter 27 may be, for example, a filter that allows light in a wavelength region of a specific color (for example, any one of red, green, and blue) to pass therethrough, for each of the pixels 12. The light-shielding film 26 blocks entrance of a part of the light that has entered one of the pixels 12, into the adjacent pixel 12. The antireflection film 25 prevents reflection of the light that has passed through the on-chip lens 28 and the color filter 27.

Each of the pixels 12 includes the photodiode PD in the silicon substrate 10. Each of the pixels 12 includes the floating diffusion section FD and the readout circuit 12A, in the epitaxial layer 20 formed on one surface of the silicon substrate 10. In other words, in each of the pixels 12, the photodiode PD is separately provided in a layer different from a layer in which the floating diffusion section FD and the readout circuit 12A are provided. In other words, the image pickup device 1 is a layered solid-state image pickup device in which the photodiode PD, and the floating diffusion section FD as well as the readout circuit 12A are laminated.

Each of the pixels 12 includes, in the silicon substrate 10, a back-surface pinning layer 22 in contact with a back surface of the photodiode PD, and a surface pinning layer 23 in contact with a surface (a top surface) of the photodiode PD. Further, each of the pixels 12 includes an element separation region 21 in the silicon substrate 10. The element separation region 21 is formed to surround a side face of the photodiode PD, and may be, for example, in contact with the side face of the photodiode PD. A laminated body including the photodiode PD and the surface pinning layer 23 serves as a photodiode. A part of the surface (the top surface) of the photodiode PD is in contact with a low-concentrated n-type region (an impurity region 10A) of the silicon substrate 10, without being covered by the surface pinning layer 23. In other words, the silicon substrate 10 includes the impurity region 10A in a part of the silicon substrate 10, the part being immediately above the photodiode PD. The impurity region 10A has uniform n-type impurity concentration distribution with almost no concentration gradient of the n-type impurity in a thickness direction. Potential distribution in the thickness direction of the impurity region 10A is substantially flat. The element separation region 21 may be formed by, for example, forming a highly-concentrated p-type region extending in the thickness direction in the silicon substrate 10, by implanting a p-type impurity into the silicon substrate 10.

Each of the pixels 12 includes the transfer transistor Tr1, the reset transistor Tr2, the select transistor Tr3, and the amplifying transistor Tr4, at the epitaxial layer 20. In the following, the reset transistor Tr2, the select transistor Tr3, and the amplifying transistor Tr4 may be collectively referred to as a pixel transistor Tr. The transfer transistor Tr1 transfers electric charge generated in the photodiode PD to the floating diffusion section FD. The transfer transistor Tr1 may include, for example, a gate oxide film 24, a gate electrode 18G, and a channel region 18C to be described later. The transfer transistor Tr1 is a so-called vertical transistor. The gate electrode 18G is embedded in the epitaxial layer 20, and the channel region 18C surrounds the gate electrode 18G. The pixel transistor Tr may include, for example, the gate oxide film 24, a gate electrode 19G, a channel region 19C, and two source-drain regions 19SD to be described later.

Each of the pixels 12 includes the channel region 19C and the two source-drain regions 19SD, in the epitaxial layer 20. The two source-drain regions 19SD are formed on both sides of the channel region 19C. Each of the pixels 12 includes the gate electrode 19G on a top surface of the epitaxial layer 20, as well as on a top surface of the channel region 19C. For example, the gate electrode 19G may be formed of a poly-silicon electrode.

Each of the pixels 12 includes, in the epitaxial layer 20, one trench 20A passing through the epitaxial layer 20. The trench 20A is formed by selectively etching the epitaxial layer 20, and may be shaped like, for example, a prism or a column. The trench 20A is formed in a part of the epitaxial layer 20, the part being of a region immediately above the photodiode PD. The silicon substrate 10 is exposed at a base of the trench 20A. The base of the trench 20A may be or may not be inside the silicon substrate 10. The trench 20A does not extend to the photodiode PD, and the base of the trench 20A is in contact with the impurity region 10A. The trench 20A may be preferably not in contact with the surface pinning layer 23 and the element separation region 21.

Each of the pixels 12 includes the gate oxide film 24, on the surface of the epitaxial layer 20 including an inner surface of the trench 20A. Each of the pixels 12 further includes the gate electrode 18G filling the trench 20A. The gate electrode 18G is formed to fill the trench 20A. The gate electrode 18G is embedded in the epitaxial layer 20 while passing through the epitaxial layer 20. A bottom face of the gate electrode 18G is in contact with the impurity region 10A, with the gate oxide film 24 interposed therebetween. The gate electrode 18G may be formed of, for example, a poly-silicon electrode.

Each of the pixels 12 includes the channel region 18C and the floating diffusion section FD, in the epitaxial layer 20. The channel region 18C controls the flow of the electric charge of the photodiode PD, and the floating diffusion section FD is in contact with the channel region 18C. The channel region 18C is formed in a part of the epitaxial layer 20, the part being of a region immediately above the photodiode PD. The channel region 18C is formed on a side face of the trench 20A and a part in proximity to this side face, in the epitaxial layer 20. The channel region 18C is formed to cover the gate electrode 18G and is shaped like a tube. The floating diffusion section FD is provided at the top surface of the epitaxial layer 20 as well as a part in proximity to this top surface, and may be, for example, in contact with a part of the channel region 18C, the part being in proximity to the top surface of the epitaxial layer 20.

The channel region 18C is formed in a process of forming the epitaxial layer 20. Specifically, the channel region 18C is formed by forming an n-type silicon epitaxial layer through In-Situ Dope epitaxial growth and then inverting a region except a region where the channel region 18C is to be formed. It is to be noted that the conductivity type of the channel region 18C is one (the n-type) in a thickness direction. Therefore, the channel region 18C is a single layer.

Figure 6:
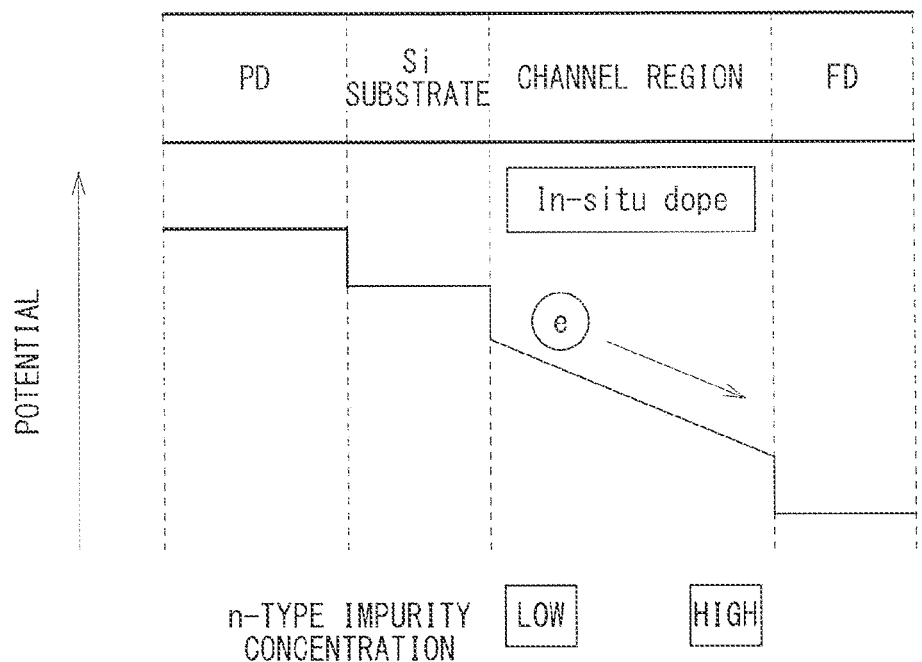
FIG. 6 is a diagram illustrating an example of potential distribution in a path from a photodiode (PD) to a floating diffusion section (FD) in the image pickup device in FIG. 5.

Incidentally, the channel region 18C has a concentration gradient of an n-type impurity, in the thickness direction. Specifically, in the channel region 18C, the n-type impurity has a concentration higher from the photodiode PD side to the floating diffusion section FD side. Besides, the channel region 18C has concentration distribution in which a curvature of a concentration gradient in the thickness direction is free from a mixture of plus and minus signs. Therefore, as illustrated in FIG. 6, in the channel region 18C, a curvature of a potential gradient is free from a mixture of plus and minus signs, and electric charge accumulation is absent. In other words, the channel region 18C has the concentration gradient in which the curvature of the potential gradient is free from a mixture of plus and minus signs, in the thickness direction. It is possible to form such a potential gradient, by providing concentration distribution in the thickness direction, in a process of performing the In-Situ Dope epitaxial growth.

Figure 7:
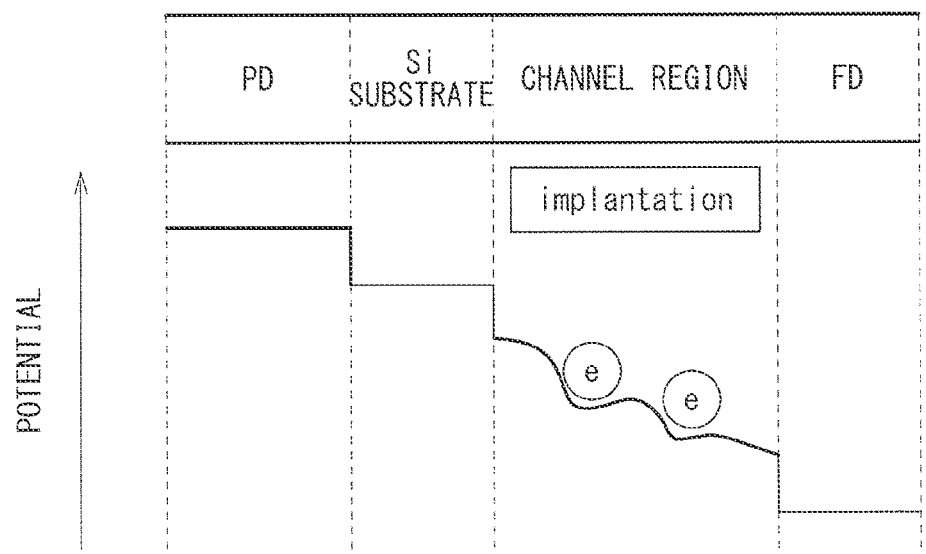
FIG. 7 is a diagram illustrating an example of potential distribution in a path from a PD to an FD in an image pickup device according to a comparative example.

It is also possible to form a concentration gradient by ion implantation. However, it is considerably difficult to change implantation energy smoothly. Therefore, when a concentration gradient is formed by ion implantation, a curvature of a potential gradient may have a mixture of plus and minus signs, and electric charge accumulation may be formed, as illustrated in FIG. 7, for example. This electric charge accumulation leads to a charge transfer failure.

It is to be noted that, in the present embodiment, besides the channel region 18C, the impurity region 10A is provided between the photodiode PD and the floating diffusion section FD. As described above, the impurity region 10A has the n-type impurity concentration distribution that is uniform, with almost no concentration gradient of the n-type impurity in the thickness direction, and the potential distribution of the impurity region 10A in the thickness direction is substantially flat. In other words, a curvature of a potential gradient is free from a mixture of plus and minus signs, and electric charge accumulation is absent, in the impurity region 10A as well.

[Method of Manufacturing]

Figure 8:
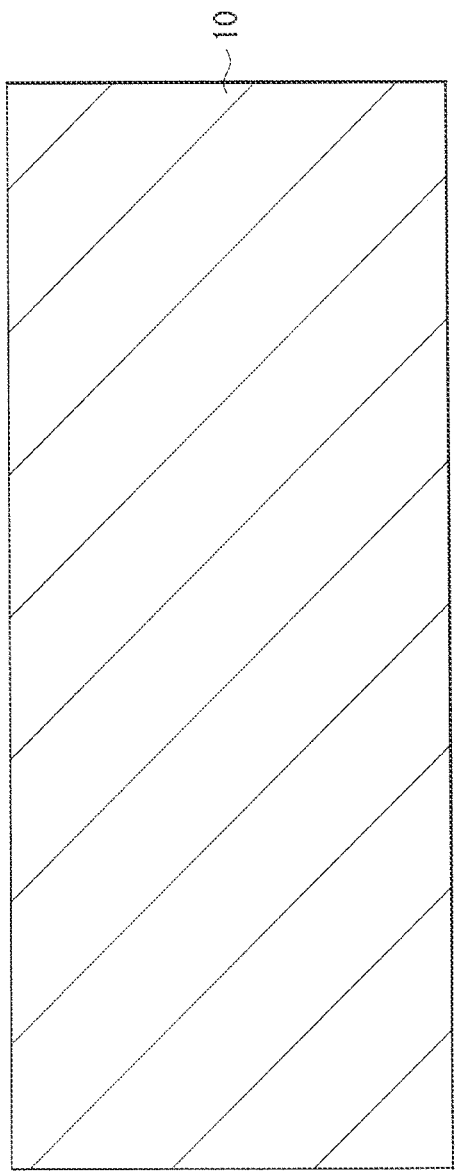
FIG. 8 is a diagram illustrating an example of a manufacturing process in manufacturing the image pickup device in FIG. 1.
Figure 9:
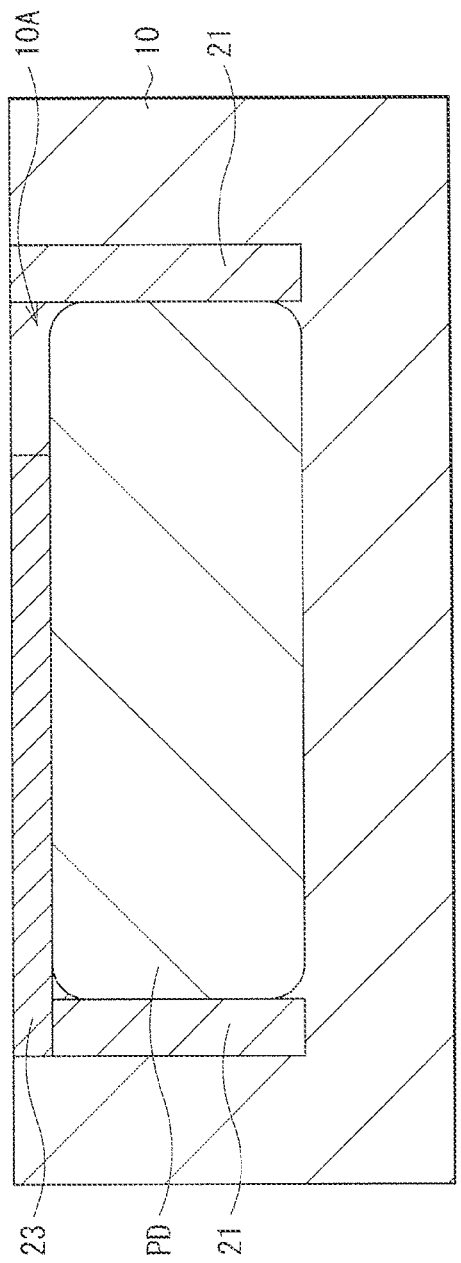
FIG. 9 is a diagram illustrating an example of a manufacturing process following the process in FIG. 8.

Next, an example of a method of manufacturing the image pickup device 1 will be described. FIGS. 8 to 16 sequentially illustrate processes of manufacturing the image pickup device 1. First, the silicon substrate 10 is prepared (FIG. 8). Next, the photodiode PD, the surface pinning layer 23, and the element separation region 21 are formed in the silicon substrate 10 (FIG. 9). The photodiode PD may be formed as follows, for example. First, an n-type region is formed in the silicon substrate 10 by implanting an n-type impurity into the silicon substrate 10. Next, a highly-concentrated n-type region, which has a higher n-type impurity concentration than that of the n-type region, is formed on a side closer to a top surface than the n-type region is. The photodiode PD may be thus formed. Further, the surface pinning layer 23 may be formed by, for example, forming a highly-concentrated p-type region having a high p-type impurity concentration, at the top surface of the silicon substrate 10, by implanting a p-type impurity into the silicon substrate 10.

Figure 10:
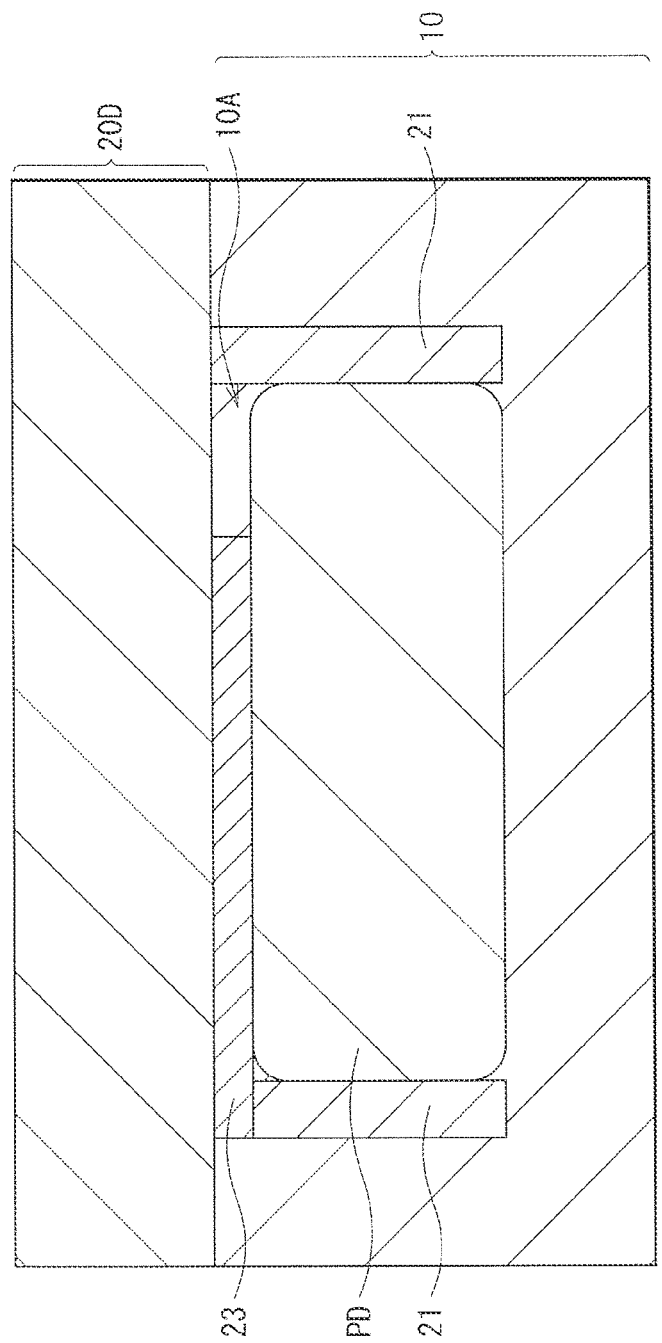
FIG. 10 is a diagram illustrating an example of a manufacturing process following the process in FIG. 9.

Next, an epitaxial layer 20D is formed on the top surface of the silicon substrate 10 including the photodiode PD (FIG. 10). In this process, the epitaxial layer 20D is formed by performing In-Situ Dope epitaxial growth. Besides, the epitaxial layer 20D is formed so that a concentration of an n-type impurity becomes higher from a lower layer to an upper layer. For example, the epitaxial layer 20D may be formed by increasing a gas flow rate of the n-type impurity for the doping over time, in a process of performing the In-Situ Dope epitaxial growth. As a result, it is possible to form the epitaxial layer 20D having a concentration gradient in which a curvature of a potential gradient is free from a mixture of plus and minus signs, in a thickness direction. It is to be noted that the conductivity type of the epitaxial layer 20D is one (the n-type) in the thickness direction. Therefore, the epitaxial layer 20D is a single layer.

Figure 11:
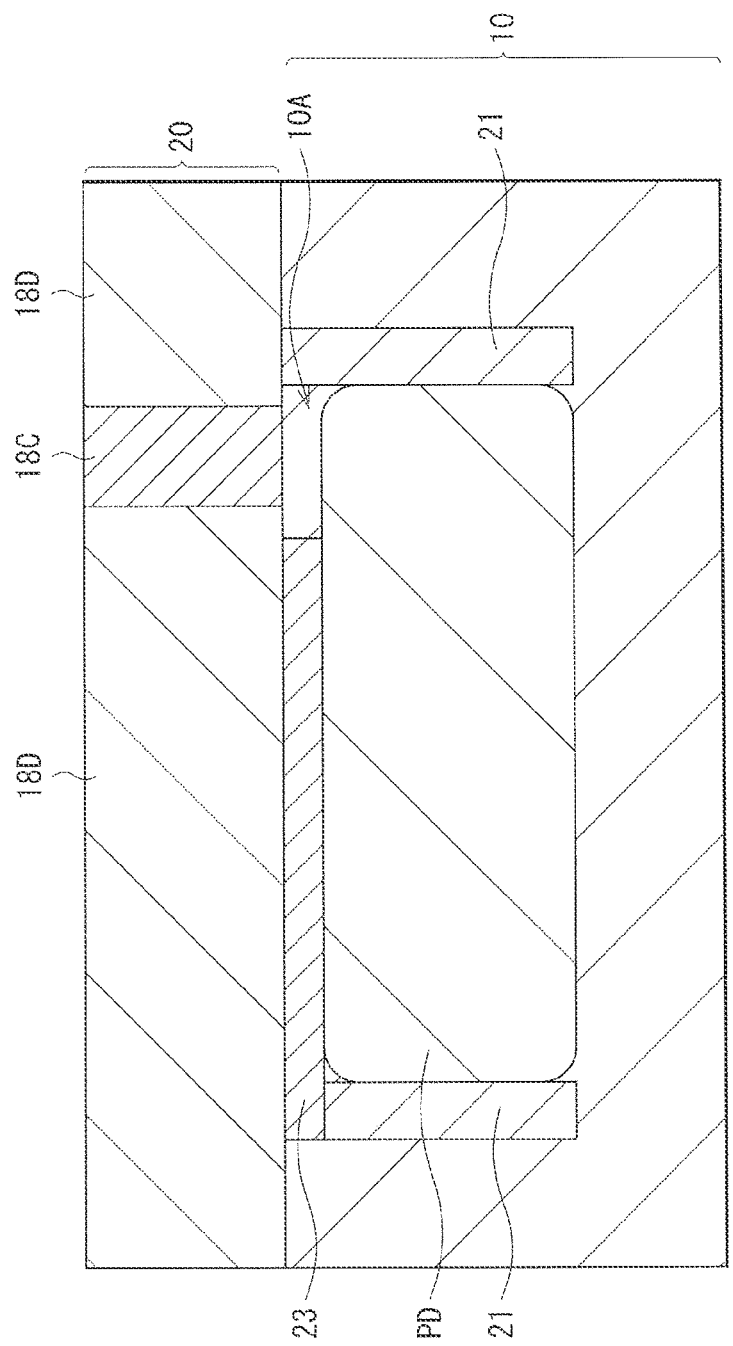
FIG. 11 is a diagram illustrating an example of a manufacturing process following the process in FIG. 10.

Next, a part of the epitaxial layer 20D is inverted. Specifically, of the epitaxial layer 20D, a region except a part of a region immediately above the photodiode PD is inverted. To be more specific, of the epitaxial layer 20D, a region except a region immediately above a region (the impurity region 10A) where the surface pinning layer 23 is not formed is inverted. Here, this inversion refers to inversion of the conductivity type from the n-type to the p-type, by implanting a p-type impurity into the epitaxial layer 20D of the conductivity type is the n-type. Therefore, the channel region 18C, which has concentration distribution in which a curvature of a potential gradient is free from a mixture of plus and minus signs in the thickness direction, is formed in a part of the epitaxial layer 20D, the part being immediately above the photodiode PD. At this moment, the channel region 18C is in contact with the impurity region 10A. Further, the channel region 18C has concentration distribution in which a curvature of a concentration gradient in the thickness direction is free from a mixture of plus and minus signs. Furthermore, the conductivity type of the channel region 18C is one (the n-type) in the thickness direction, and the channel region 18C is a single layer. It is to be noted that, of the epitaxial layer 20D, a region except the channel region 18C becomes a p-type inversion layer 18D. The epitaxial layer 20 may be thus formed (FIG. 11).

Figure 12:
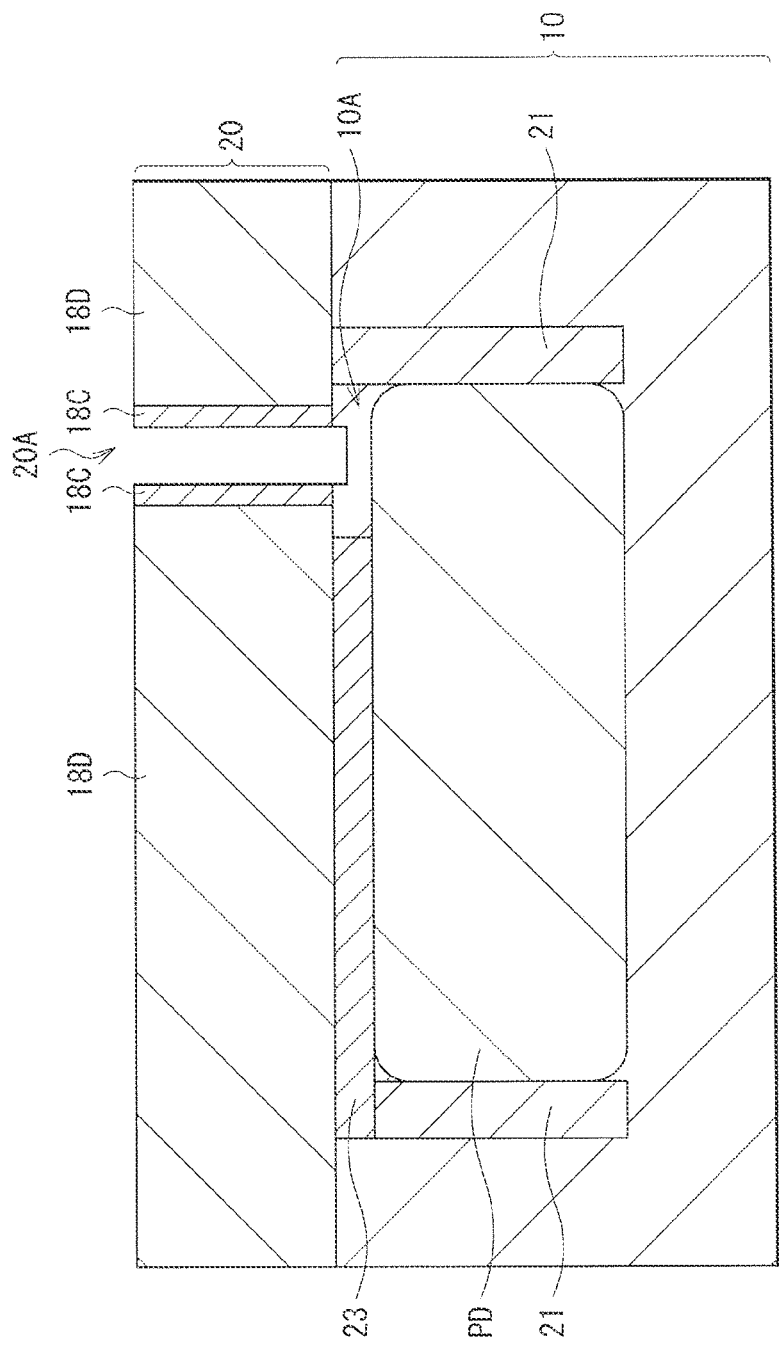
FIG. 12 is a diagram illustrating an example of a manufacturing process following the process in FIG. 11.
Figure 13:
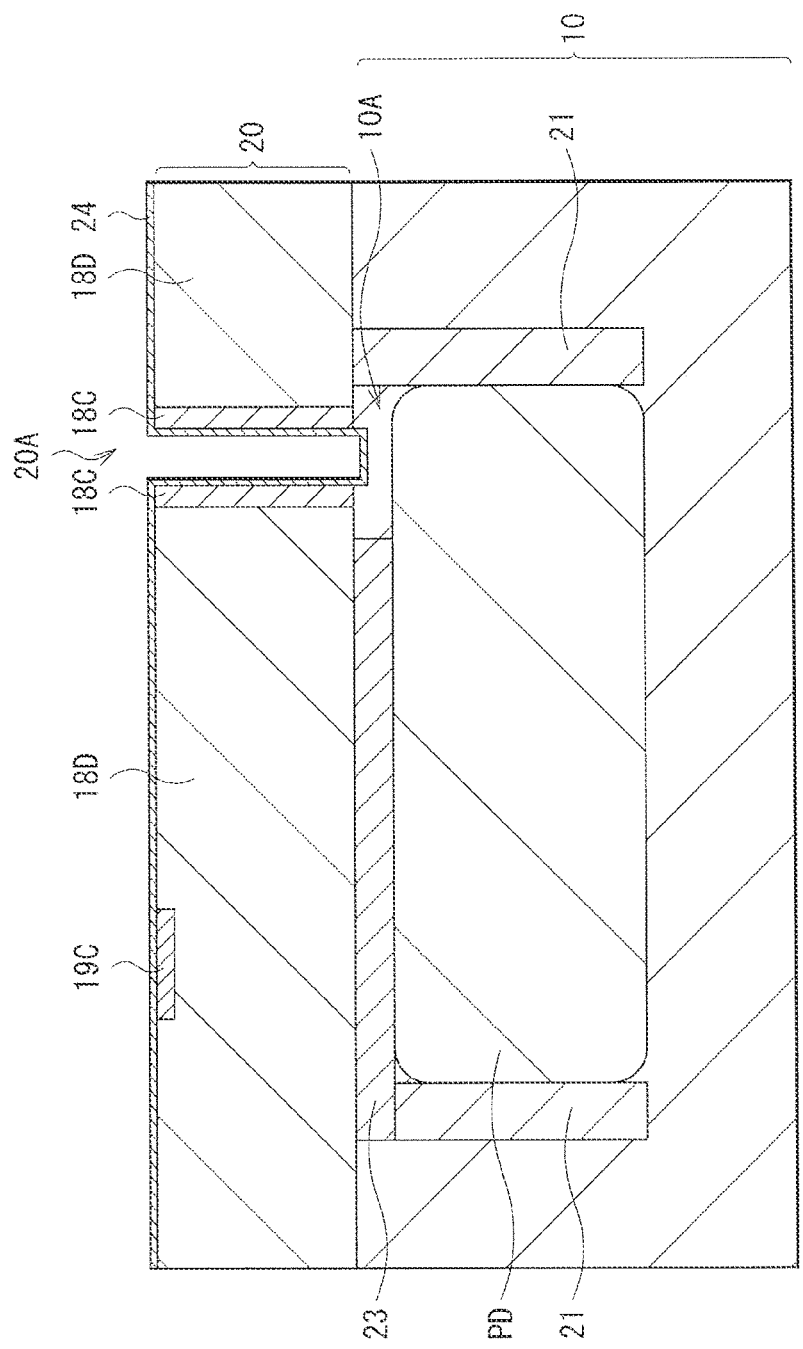
FIG. 13 is a diagram illustrating an example of a manufacturing process following the process in FIG. 12.

Next, the trench 20A passing through the epitaxial layer 20 (specifically, the channel region 18C) is formed (FIG. 12). Subsequently, the channel region 19C is formed at a predetermined position in the epitaxial layer 20, and then a gate insulating film 24 is formed over the entire surface including the inner surface of the trench 20A (FIG. 13). The channel region 19C may be formed by, for example, forming an n-type region at the top surface of the epitaxial layer 20 as well as a part in proximity to this top surface, by implanting an n-type impurity into the epitaxial layer 20. Further, the gate insulating film 24 may be formed by, for example, subjecting the surface of the epitaxial layer 20 to thermal oxidation.

Figure 14:
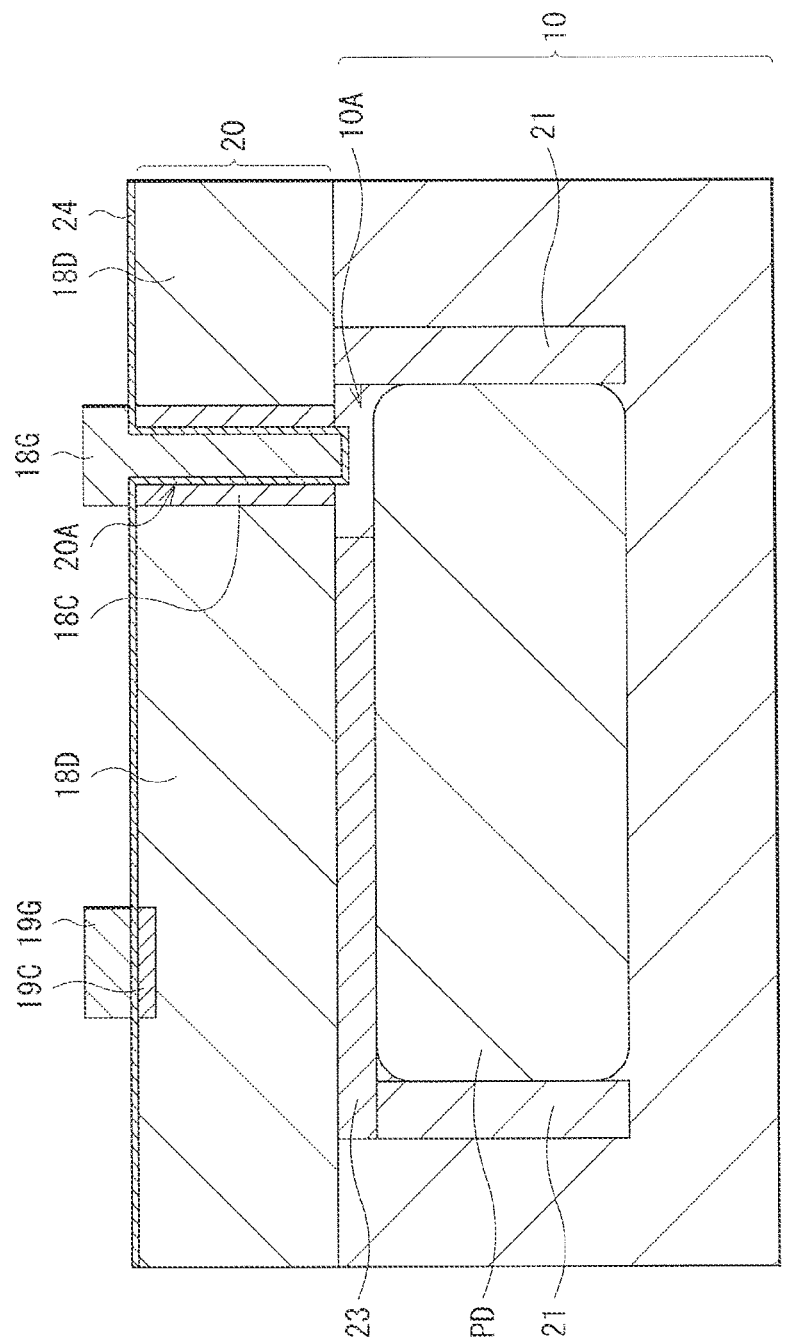
FIG. 14 is a diagram illustrating an example of a manufacturing process following the process in FIG. 13.
Figure 15:
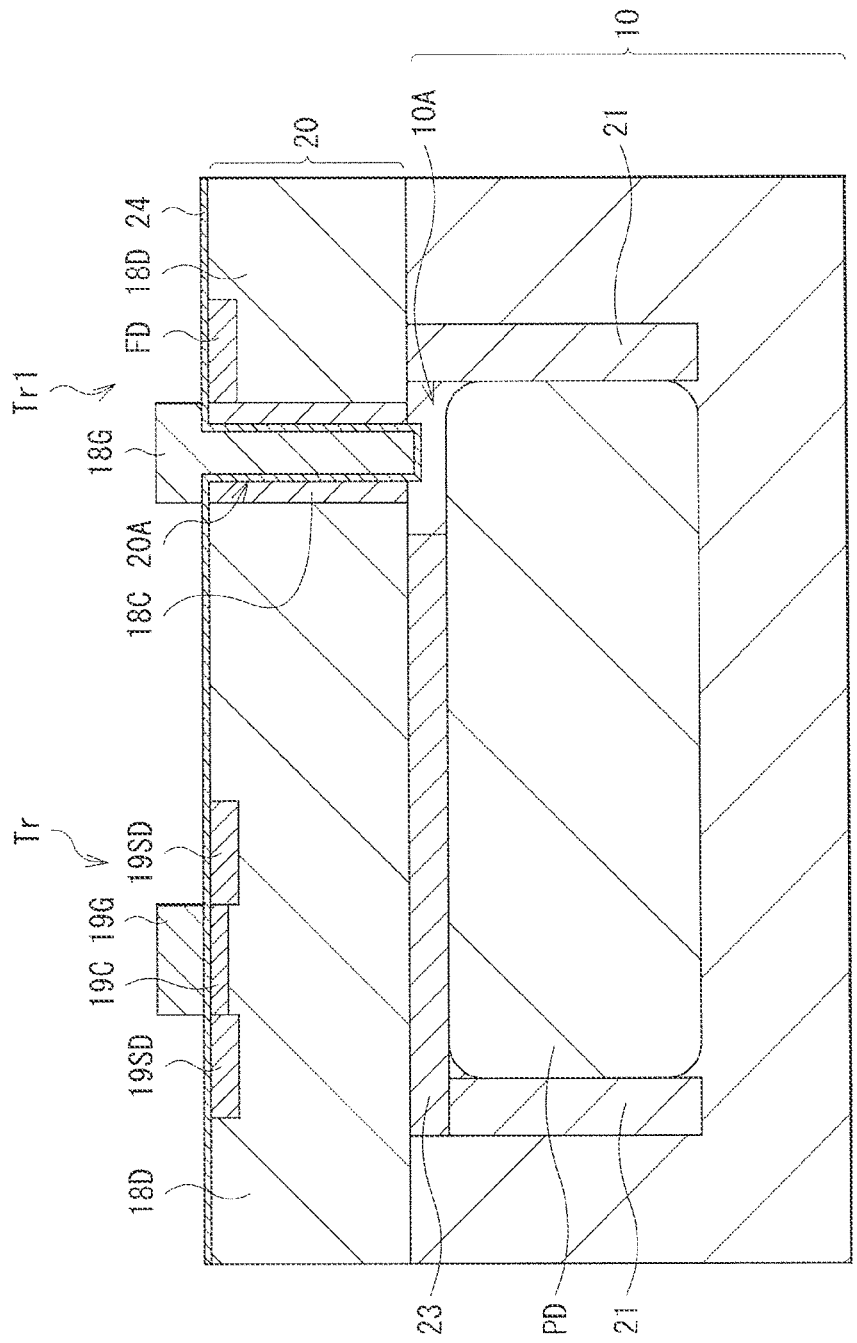
FIG. 15 is a diagram illustrating an example of a manufacturing process following the process in FIG. 14.

Next, the gate electrode 18G filling the trench 20A, and the gate electrode 19G in contact with the channel region 19C are formed with the gate insulating film 24 interposed therebetween (FIG. 14). Subsequently, the floating diffusion section FD and the source-drain regions 19SD are formed in the epitaxial layer 20 (FIG. 15). The floating diffusion section FD may be formed by, for example, forming an n-type region at the top surface of the epitaxial layer 20 as well as a part in proximity to this top surface, by implanting an n-type impurity into the epitaxial layer 20. Further, the source-drain regions 19SD may formed by, for example, forming an n-type region at the top surface of the epitaxial layer 20 and a part in proximity to this top surface, as well as on both sides of the channel region 19C, by implanting an n-type impurity into the epitaxial layer 20. The readout circuit 12A may be thus formed in the epitaxial layer 20.

Figure 16:
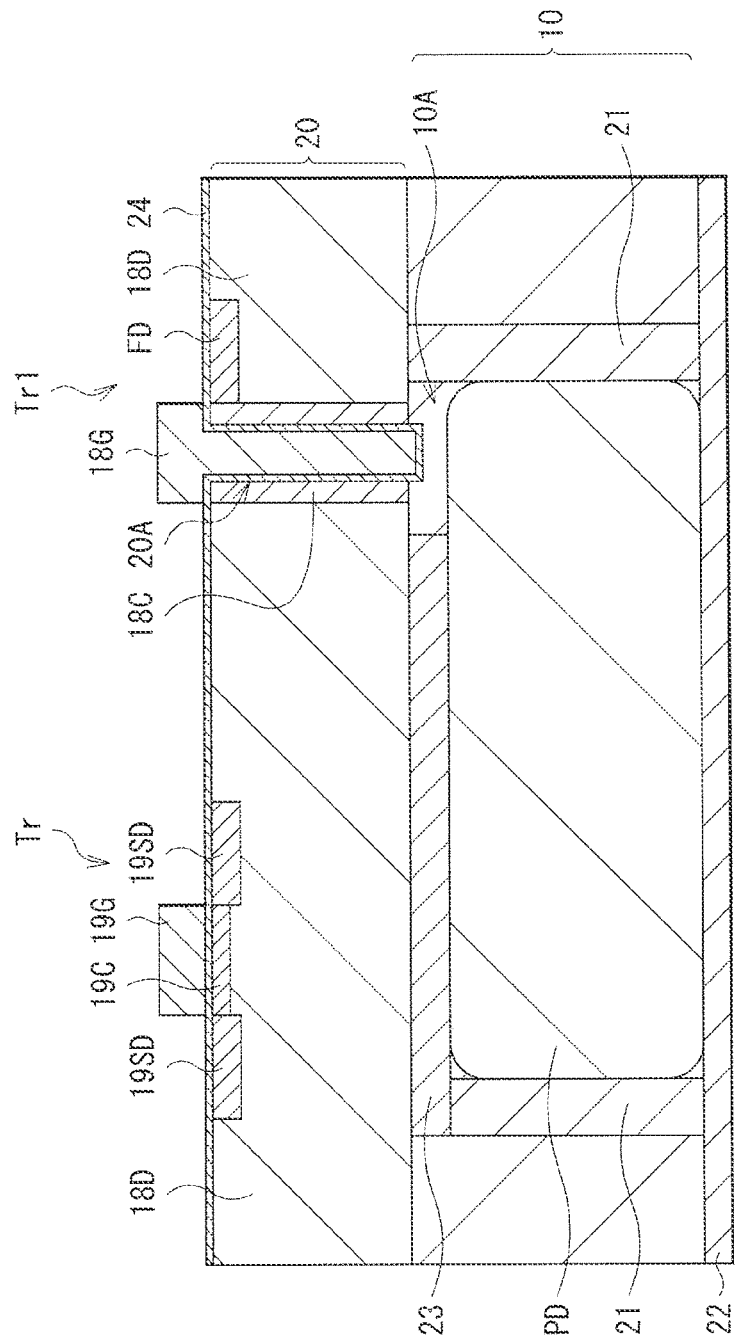
FIG. 16 is a diagram illustrating an example of a manufacturing process following the process in FIG. 15.

Next, the silicon substrate 10 is thinned by etching a back surface of the silicon substrate 10, and then the back-surface pinning layer 22 is formed at the back surface of the silicon substrate 10 as well as a part in proximity to this back surface (FIG. 16). The back-surface pinning layer 22 may be formed by, for example, forming a highly-concentrated p-type region having a high p-type impurity concentration at the back surface of the silicon substrate 10, by implanting a p-type impurity into the thinned back surface of the silicon substrate 10. Finally, at the back surface of the silicon substrate 10, the antireflection film 25, the light-shielding film 26, the color filter 27, and the on-chip lens 28 are formed. The image pickup device 1 is thus manufactured.

[Operation]

Next, an example of operation of the image pickup device 1 will be described. In the image pickup device 1, at first, the reset transistor Tr2 and the transfer transistor Tr1 change to the ON state. Then, the electric potential of the floating diffusion section FD is reset to the electric potential of the power supply line VDD, and a predetermined voltage is applied to the photodiode PD. Subsequently, in a predetermined period, the reset transistor Tr2 is in an OFF state, and the transfer transistor Tr1 is in the ON state. Meanwhile, when outside light enters the pixel region 11 through an optical component such as the on-chip lens 28, a part of the entering light is photoelectrically converted in the photodiode PD, and an amount of electric charge corresponding to intensity of the entering light is stored for each of the pixels 12. By an electric field generated by a voltage applied to the pixel 12, the stored electric charge is collected on the transfer transistor Tr1 side, and then temporarily stored in the floating diffusion section FD. Subsequently, when the transfer transistor Tr1 changes to an OFF state and the select transistor Tr3 changes to the ON state at predetermined timing, the electric potential of the floating diffusion section FD is amplified, and a voltage corresponding to this electric potential is outputted to the column processing circuit 14.

[Effects]

Next, effects of the image pickup device 1 of the present embodiment will be described. In the present embodiment, the photodiode PD and the transfer transistor Tr1 are provided in the different layers. This eliminates limitation in terms of an area that ensures minimum characteristics of the photodiode PD and the transfer transistor Tr1. Further, the channel region 18C of the transfer transistor Tr1 has the concentration gradient in which the curvature of the potential gradient is free from a mixture of plus and minus signs, in the thickness direction. This suppresses electric charge accumulation in the channel region 18C and therefore, transfer characteristics of the electric charge in the transfer transistor Tr1 improve. As a result, it is possible to deepen the potential of the photodiode PD. Therefore, in the image pickup device 1, it is possible to improve characteristics including a saturated charge amount and sensitivity, as compared with a case in which the photodiode PD and the transfer transistor Tr1 are provided in the same layer.

2. Second Embodiment

Figure 17:
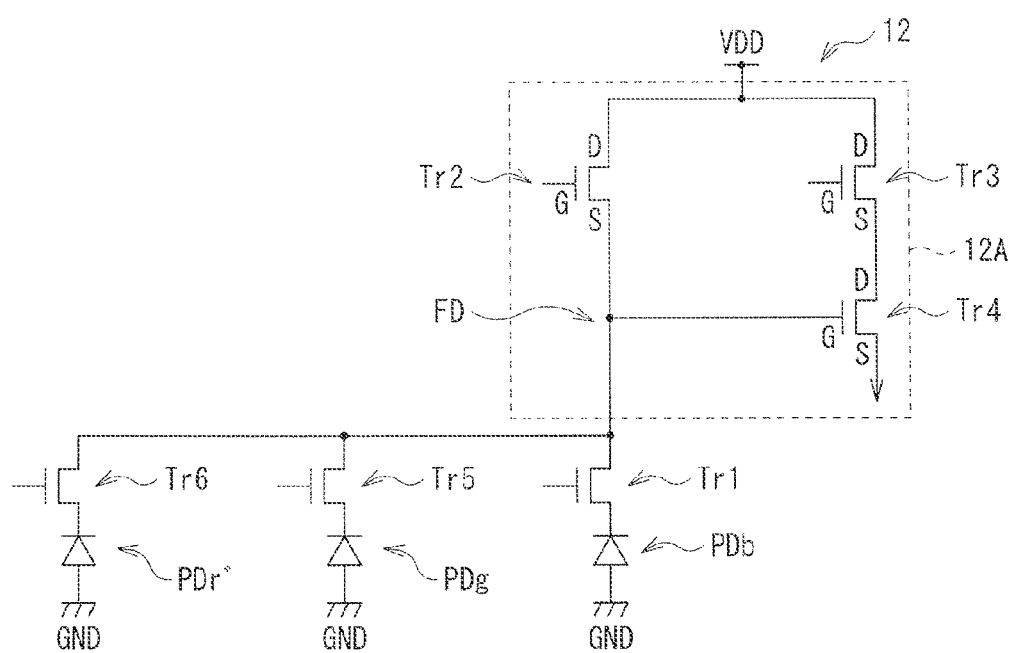
FIG. 17 is a diagram illustrating an example of a circuit configuration of a pixel in an image pickup device according to a second embodiment of the present technology.
Figure 18:
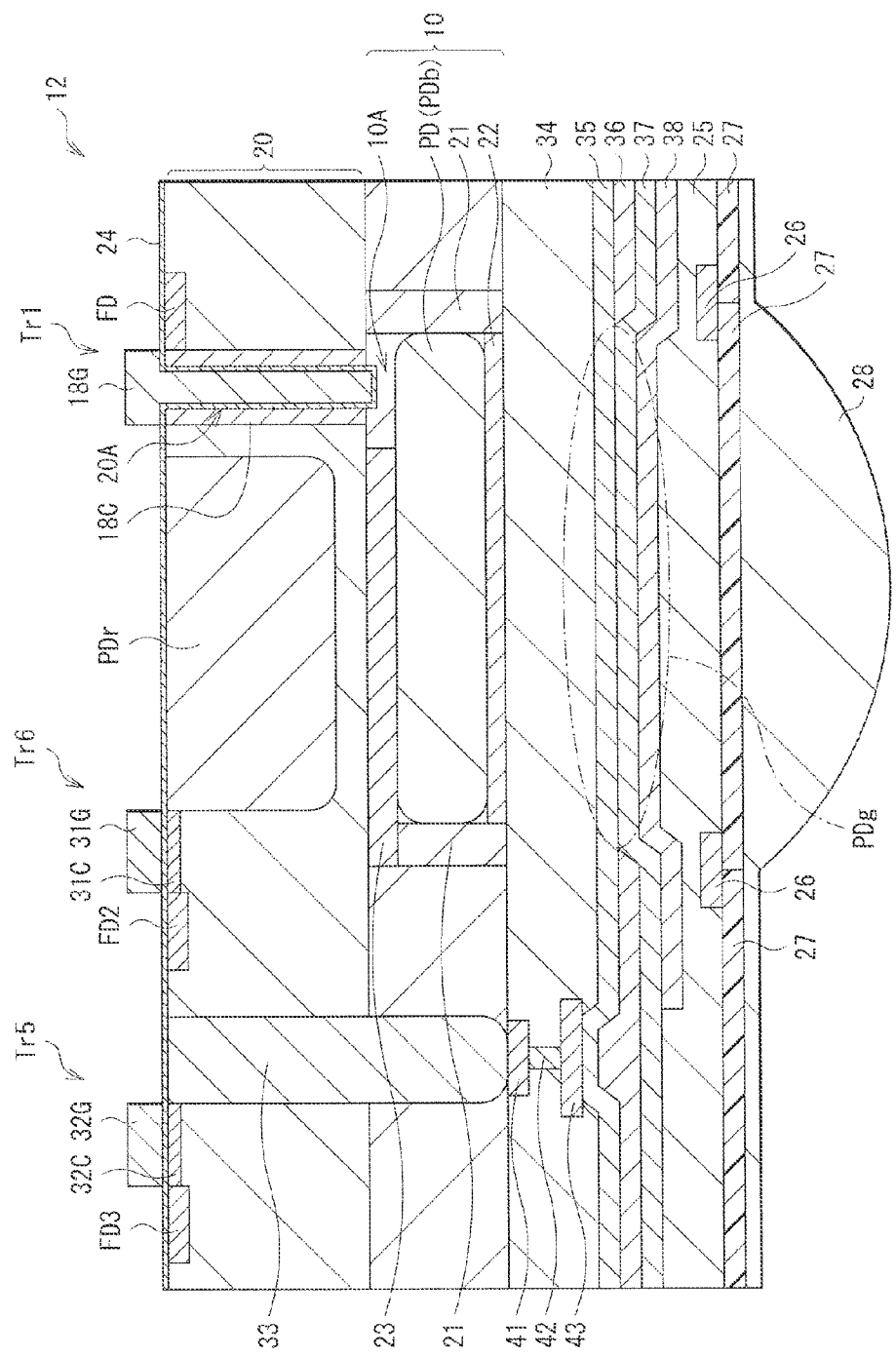
FIG. 18 is a diagram illustrating an example of a cross-sectional configuration of the pixel in FIG. 17.

An image pickup device according to a second embodiment of the present technology will be described. It is to be noted that the same components as those of the above-described first embodiment will be provided with the same reference numerals as those thereof, and the description of these components will be omitted as appropriate. FIG. 17 illustrates an example of a circuit configuration of the pixel 12 in the image pickup device 1 according to the present embodiment. FIG. 18 illustrates an example of a cross-sectional configuration of the image pickup device 1 in FIG. 17. In the present embodiment, the pixel 12 includes three photodiodes PD (PDr, PDg, and PDb). In this respect, the present embodiment has a configuration different from that of the above-described embodiment in which the one photodiode PD is provided. The three photodiodes PD (PDr, PDg, and PDb) are connected in parallel to each other. A transfer transistor Tr6 is connected to the photodiode PDr in series, and a transfer transistor Tr5 is connected to the photodiode PDg in series, while the transfer transistor Tr1 is connected to the photodiode PDb in series. The photodiode PDb has a configuration similar to that of the photodiode PD of the above-described embodiment.

The image pickup device 1 includes the photodiode PDr in the epitaxial layer 20. The photodiode PDr is formed at a position facing the photodiode PDb, in the epitaxial layer 20. The photodiode PDr is configured using an inorganic material. The image pickup device 1 includes the transfer transistor Tr6 in the epitaxial layer 20. The transfer transistor Tr6 is formed at a position adjacent to the photodiode PDr, in the epitaxial layer 20. The transfer transistor Tr6 may include, for example, the gate oxide film 24, a channel region 31C, and a gate electrode 31G. The image pickup device 1 further includes a floating diffusion section FD2 in the epitaxial layer 20. The floating diffusion section FD2 is connected to the photodiode PDr through the transfer transistor Tr6.

The image pickup device 1 includes the photodiode PDg on the back-surface side of a silicon substrate 10. For example, the photodiode PDg may be formed between the back surface of the silicon substrate 10 and the antireflection film 25. The image pickup device 1 includes a charge transfer path 33 extending in the silicon substrate 10 and the epitaxial layer 20. The charge transfer path 33 is formed to extend in a thickness direction, to connect connection sections 41, 42, and 43 to the transfer transistor Tr5 electrically. The connection sections 41, 42, and 43 are electrically connected to the photodiode PDg. The image pickup device 1 includes the transfer transistor Tr5 in the epitaxial layer 20. The transfer transistor Tr5 is formed at a position adjacent to the charge transfer path 33, in the epitaxial layer 20. The transfer transistor Tr5 may include, for example, the gate oxide film 24, a channel region 32C, and a gate electrode 32G. The image pickup device 1 further includes a floating diffusion section FD3 in the epitaxial layer 20. The floating diffusion section FD3 is connected to the photodiode PDg, through the transfer transistor Tr5 and the charge transfer path 33.

The image pickup device 1 may include, for example, an interlayer insulating film 34, an electrode film 35, a pixel-region formation film 36, an organic photoelectric conversion film 37, and an electrode film 38, on the back-surface side of the silicon substrate 10. A laminated body including the electrode film 35, the organic photoelectric conversion film 37, and the electrode film 38 forms the photodiode PDg. The photodiode PDg is formed in a region between the photodiode PDb and the on-chip lens 28. In other words, in the present embodiment, the three photodiodes PD (PDr, PDg, and PDb) are all disposed on an optical axis of the on-chip lens 28.

The organic photoelectric conversion film 37 photoelectrically converts light in a predetermined wavelength band, and includes an organic material. The organic photoelectric conversion film 37 is a sheet-like film provided to be common to all the pixels 12, and is formed over the entire pixel region 11. The electrode films 35 and 38 are each configured using a light-transmissive conductive material. The light-transmissive conductive material may be, for example, metal or an alloy including at least one of Mg, Ag, Al, Cu, and Au. The light-transmissive conductive material may be a material obtained by including at least one of Ca and Li in the above-described metal or the above-described alloy. Examples of the light-transmissive conductive material may further include ITO and IZO. The light-transmissive conductive material may only be a material that allows light in a wavelength band, which is capable of being photoelectrically converted in the organic photoelectric conversion film 37, to pass therethrough. The light-transmissive conductive material may be, for example, a material that allows visible light to pass therethrough. The pixel-region formation film 36 is a film that defines an in-plane shape of the photodiode PDg, and has an opening at a position facing the photodiode PDb. The pixel-region formation film 36 may be made of, for example, any of a silicon nitride film, an Si oxynitride film, an aluminum oxide film, and a laminated film including two or more of these films. The interlayer insulating film 34 is a layer that forms a surface for formation of the photodiode PDg, and provided to wire the connection sections 41, 42, and 43 connected to the photodiode PDg. The interlayer insulating film 34 may be made of, for example, any of a silicon nitride film, an Si oxynitride film, an aluminum oxide film, and a laminated film including two or more of these films.

[Effects]

Next, effects of the image pickup device 1 of the present embodiment will be described. In the present embodiment, the photodiode PDb and the transfer transistor Tr1 are provided in the different layers, as with the first embodiment. This eliminates limitation in terms of an area that ensures minimum characteristics of the photodiode PDb and the transfer transistor Tr1. Further, the channel region 18C of the transfer transistor Tr1 has a concentration gradient in which a curvature of a potential gradient is free from a mixture of plus and minus signs, in a thickness direction. This suppresses electric charge accumulation in the channel region 18C, thereby improving transfer characteristics of electric charge in the transfer transistor Tr1. As a result, a potential of the photodiode PDb is allowed to be deepened. Therefore, in the image pickup device 1, it is possible to improve characteristics including a saturated charge amount and sensitivity, as compared with a case in which the photodiode PDb and the transfer transistor Tr1 are provided in the same layer.

Next, modifications of the image pickup device 1 of the above-described first and second embodiments will be described.

3. First Modification

Figure 19:
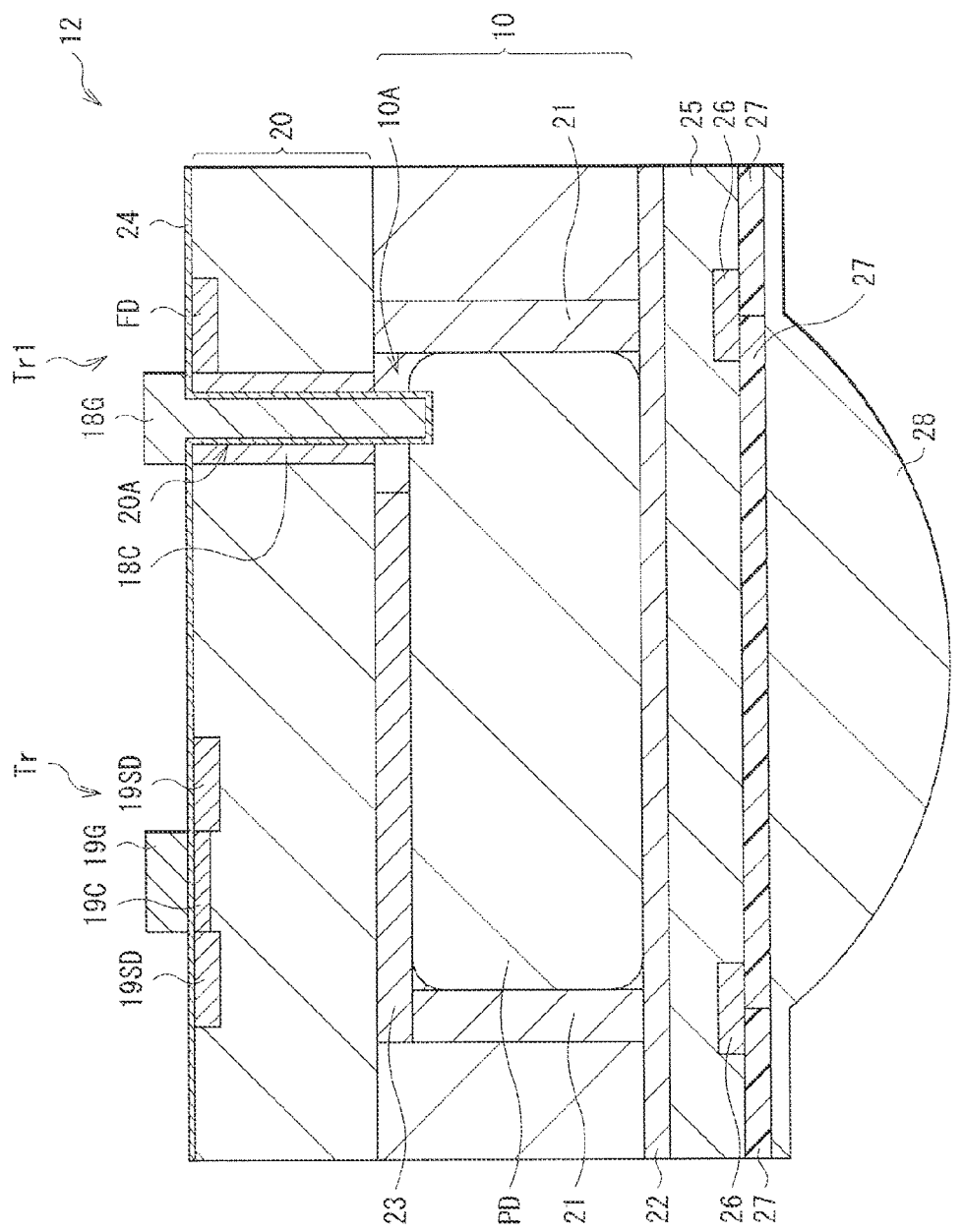
FIG. 19 is a diagram illustrating an example of a cross-sectional configuration of a pixel according to a first modification.
Figure 20:
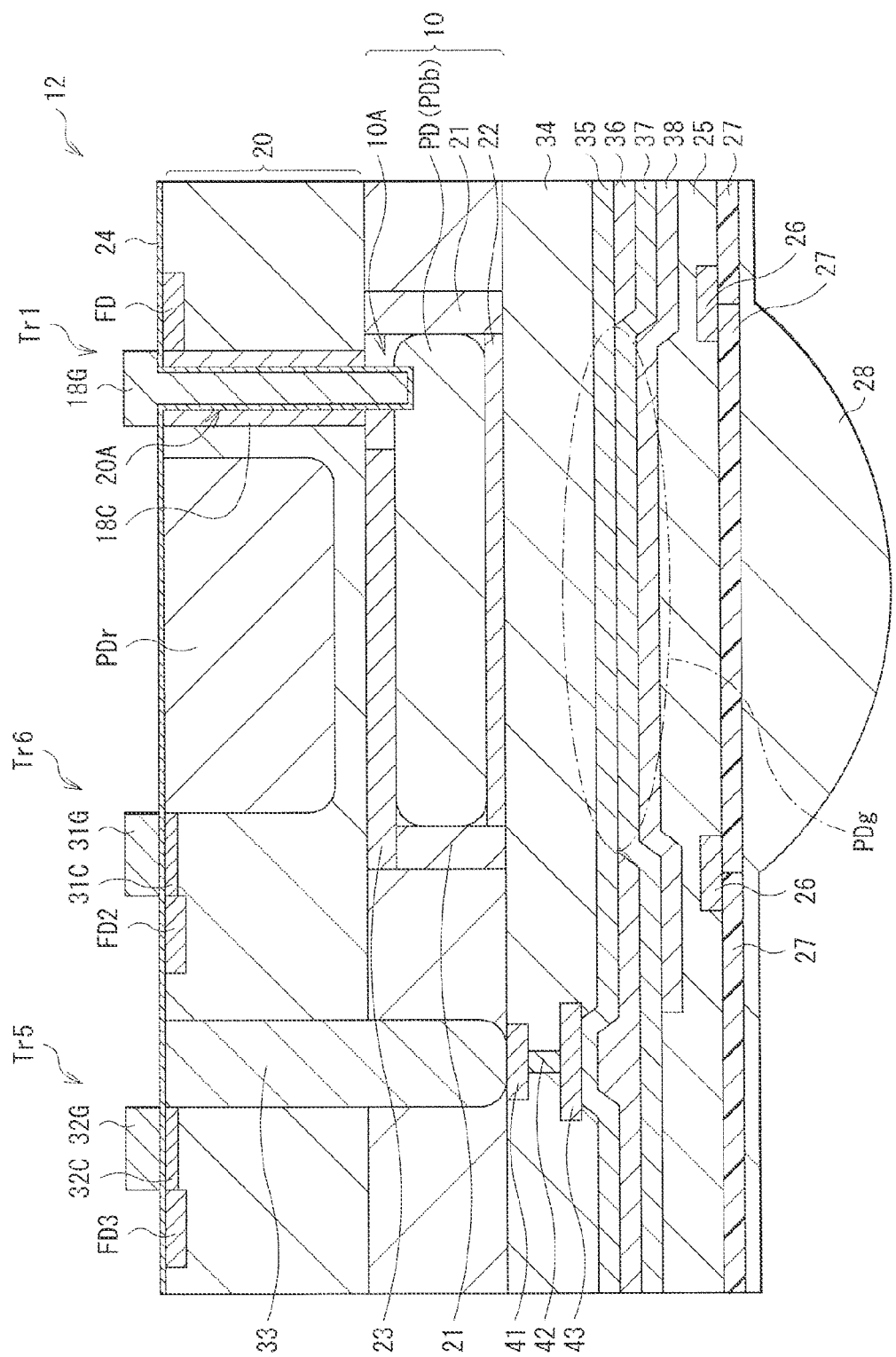
FIG. 20 is a diagram illustrating an example of a cross-sectional configuration of another pixel according to the first modification.
Figure 21:
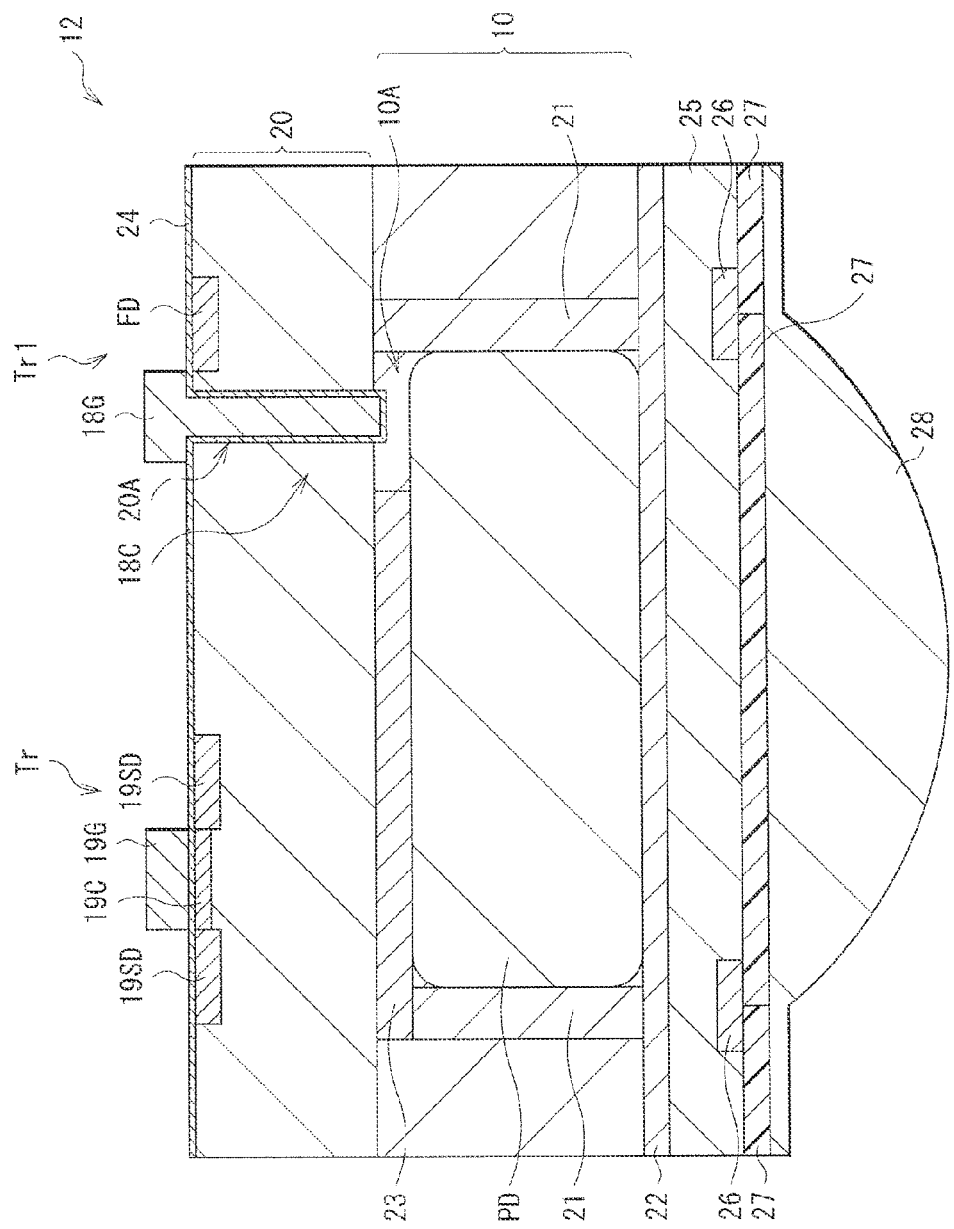
FIG. 21 is a diagram illustrating an example of a cross-sectional configuration of a pixel according to a second modification.
Figure 22:
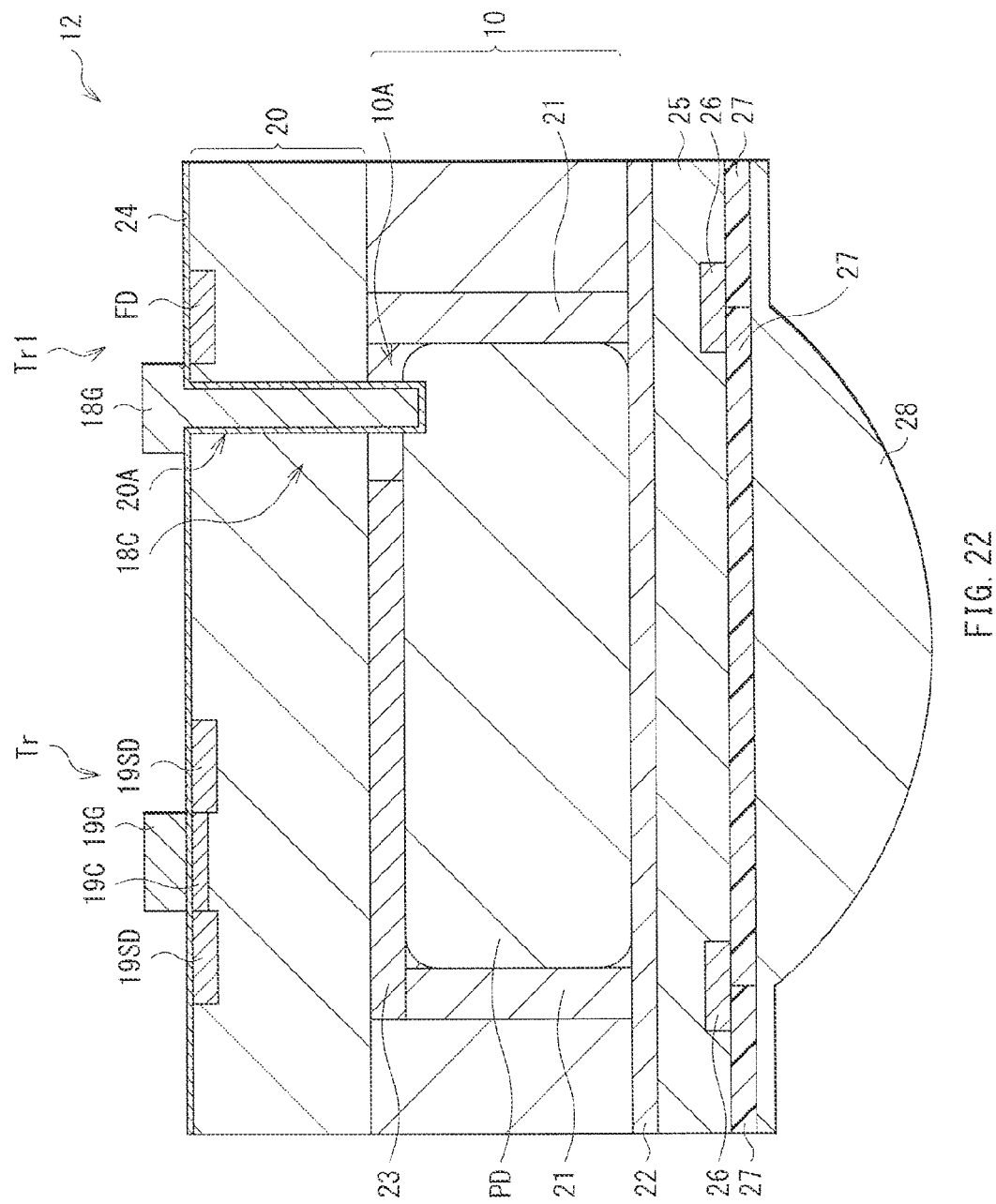
FIG. 22 is a diagram illustrating an example of a cross-sectional configuration of another pixel according to the second modification.
Figure 23:
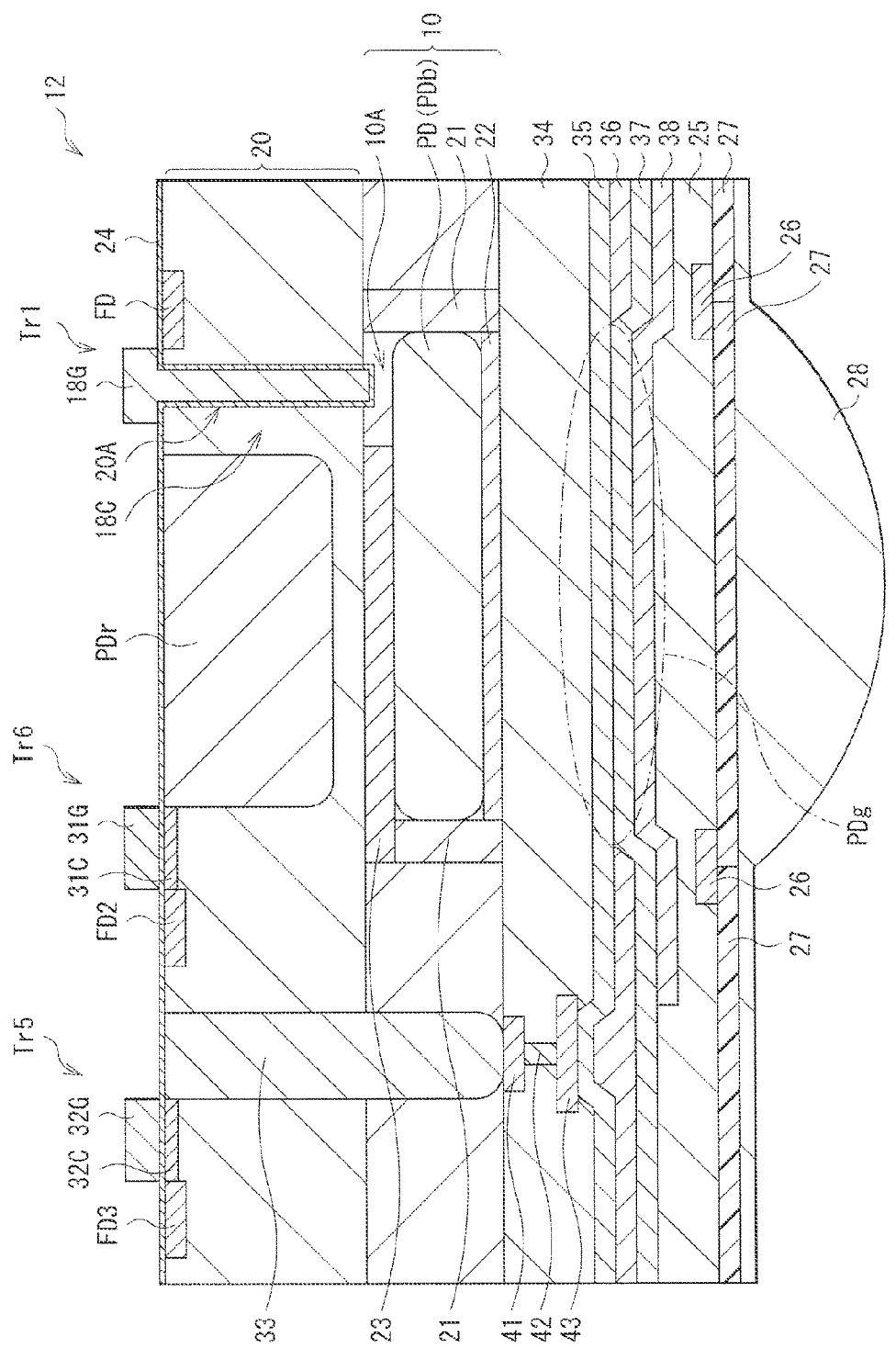
FIG. 23 is a diagram illustrating an example of a cross-sectional configuration of another pixel according to the second modification.
Figure 24:
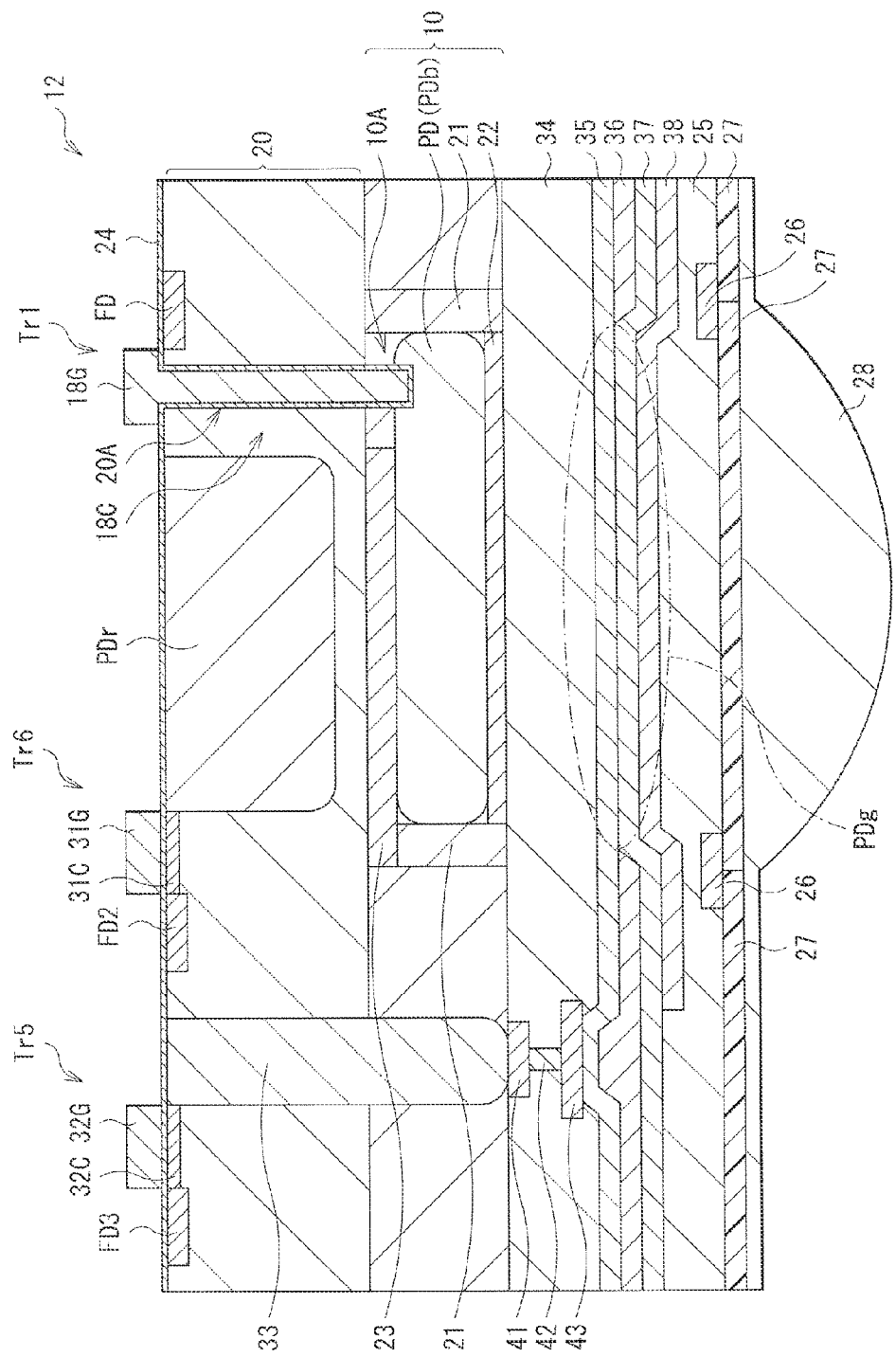
FIG. 24 is a diagram illustrating an example of a cross-sectional configuration of another pixel according to the second modification.

In the above-described first and second embodiments, the base of the trench 20A is in contact with the impurity region 10A. However, for example, the trench 20A may extend to the photodiode PD (or PDb) by passing through the impurity region 10A, as illustrated in FIGS. 19 and 20. In this case, the base of the trench 20A is in contact with the photodiode PD (or PDb). However, in this case as well, the channel region 18C is formed in the epitaxial layer 20, without extending to the photodiode PD (or PDb). Therefore, the channel region 18C has concentration distribution in which a curvature of a potential gradient is free from a mixture of plus and minus signs, in a thickness direction. Further, likewise, the impurity region 10A has concentration distribution in which a curvature of a potential gradient is free from a mixture of plus and minus signs, in a thickness direction. Therefore, in the present modification as well, it is possible to improve characteristics including a saturated charge amount and sensitivity further, as compared with a case in which the photodiode PDb and the transfer transistor Tr1 are provided in the same layer.

4. Second Modification

In the above-described first and second embodiments as well as the modification (the first modification) thereof, the channel region 18C is formed by forming the n-type epitaxial layer 20D through the In-Situ Dope epitaxial growth and then inverting the region except the region where the channel region 18C is to be formed. However, for example, as illustrated in FIGS. 21 to 24, the channel region 18C may be configured of a p-type silicon epitaxial layer having a concentration gradient of a p-type impurity in a thickness direction, through In-Situ Dope epitaxial growth.

Figure 25:
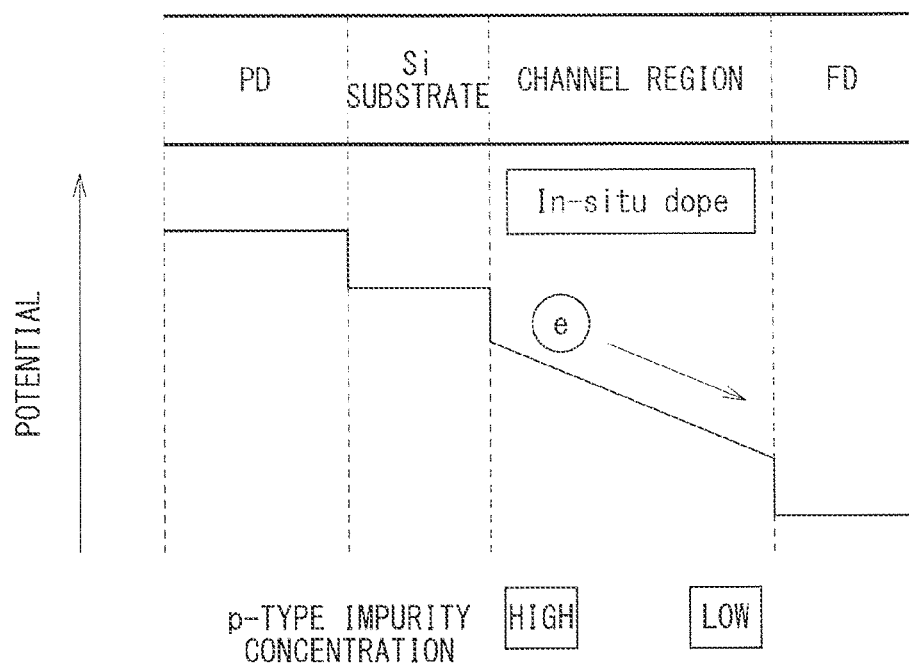
FIG. 25 is a diagram illustrating an example of potential distribution in a path from a PD to an FD in an image pickup device in each of FIGS. 21 to 24.
Figure 26:
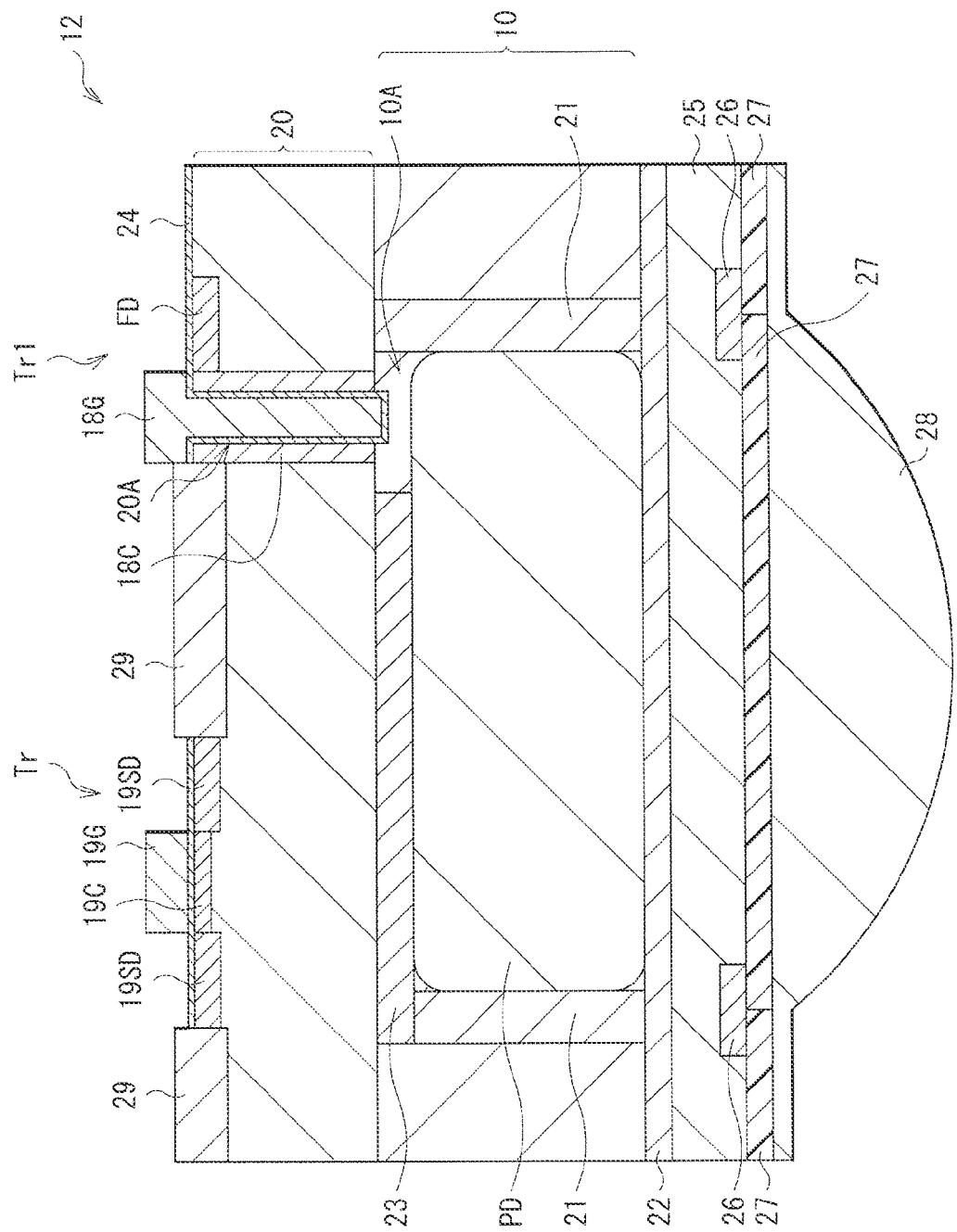
FIG. 26 is a diagram illustrating an example of a cross-sectional configuration of a pixel according to a third modification.
Figure 27:
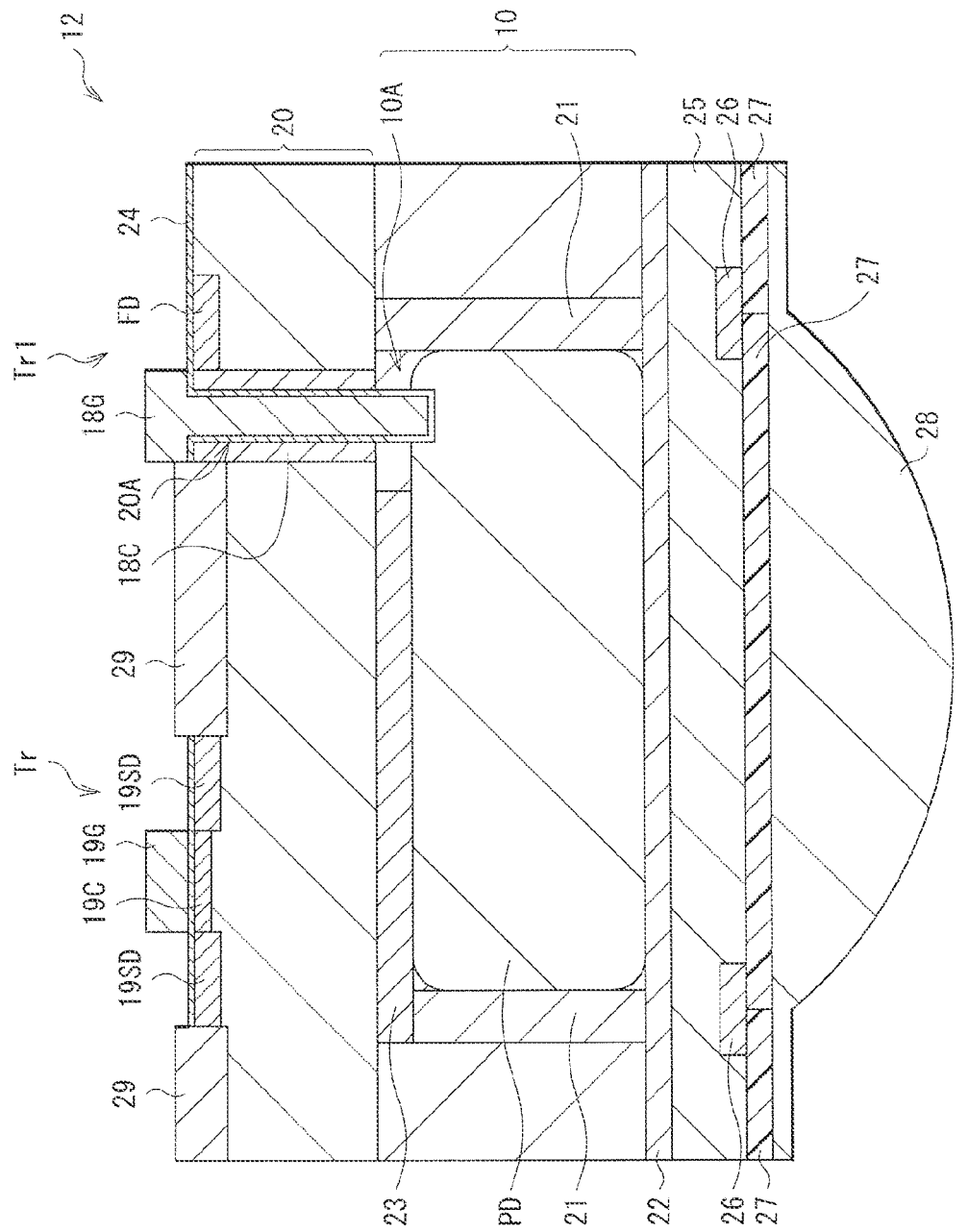
FIG. 27 is a diagram illustrating an example of a cross-sectional configuration of another pixel according to a third modification.
Figure 28:
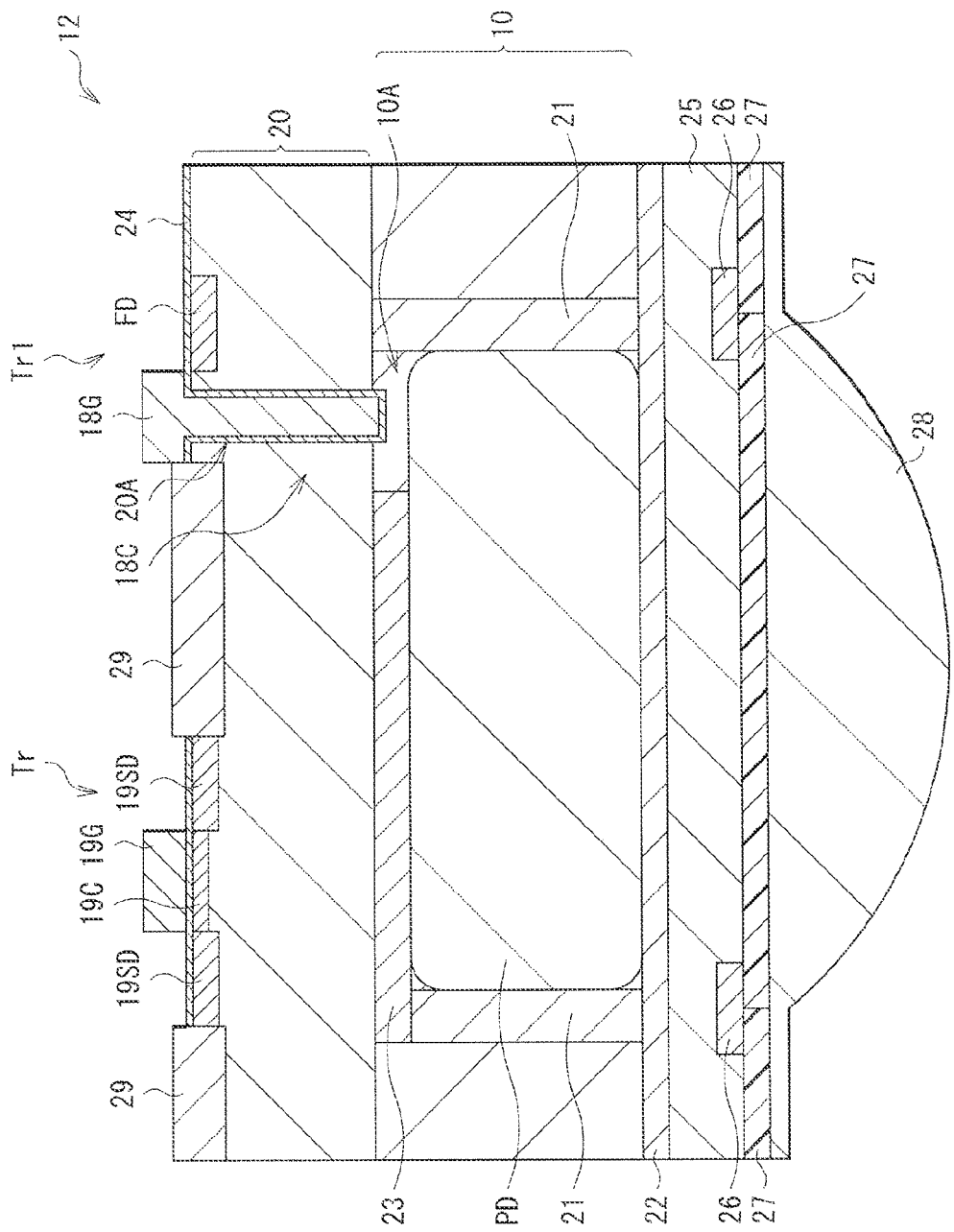
FIG. 28 is a diagram illustrating an example of a cross-sectional configuration of another pixel according to the third modification.
Figure 29:
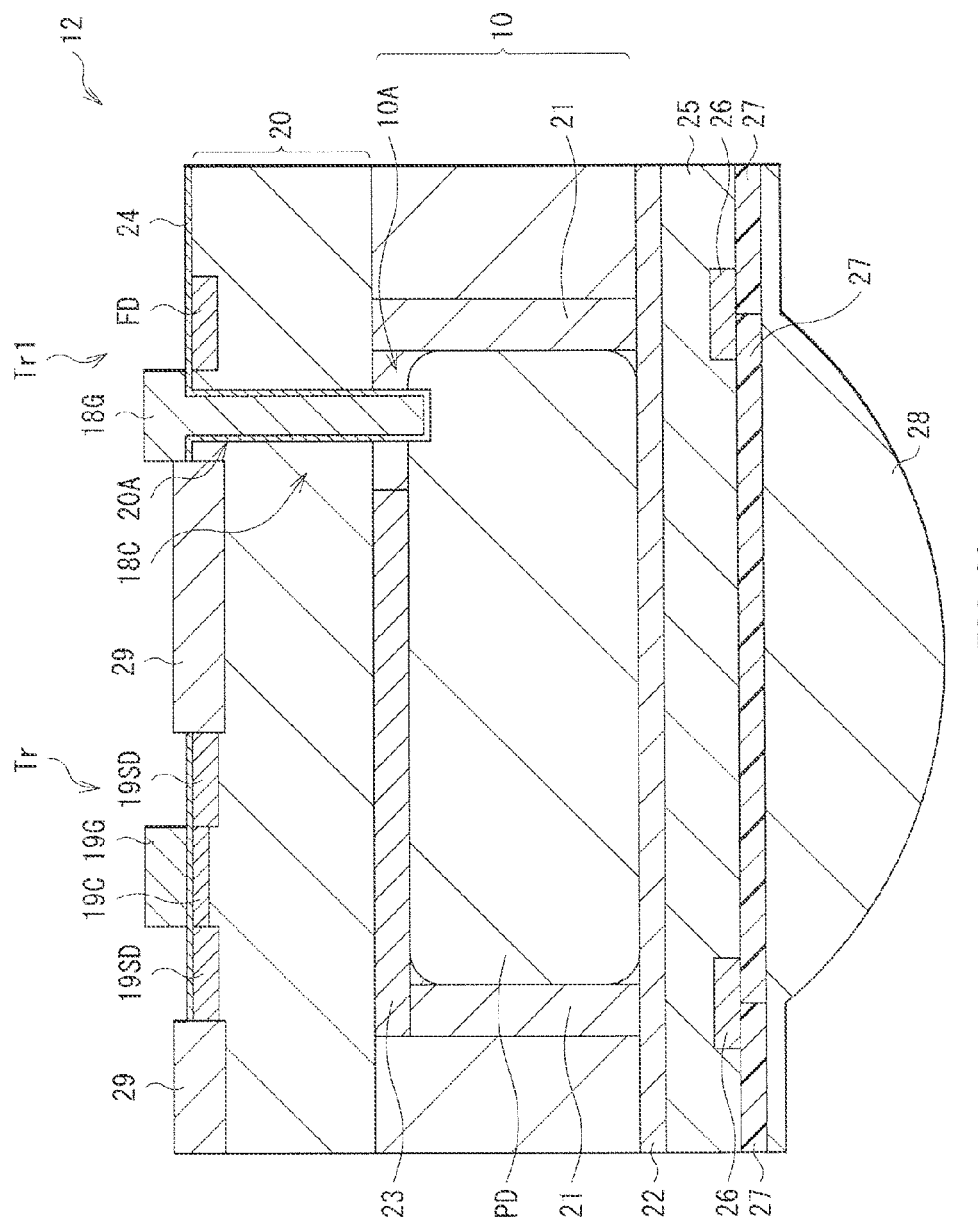
FIG. 29 is a diagram illustrating an example of a cross-sectional configuration of another pixel according to the third modification.
Figure 30:
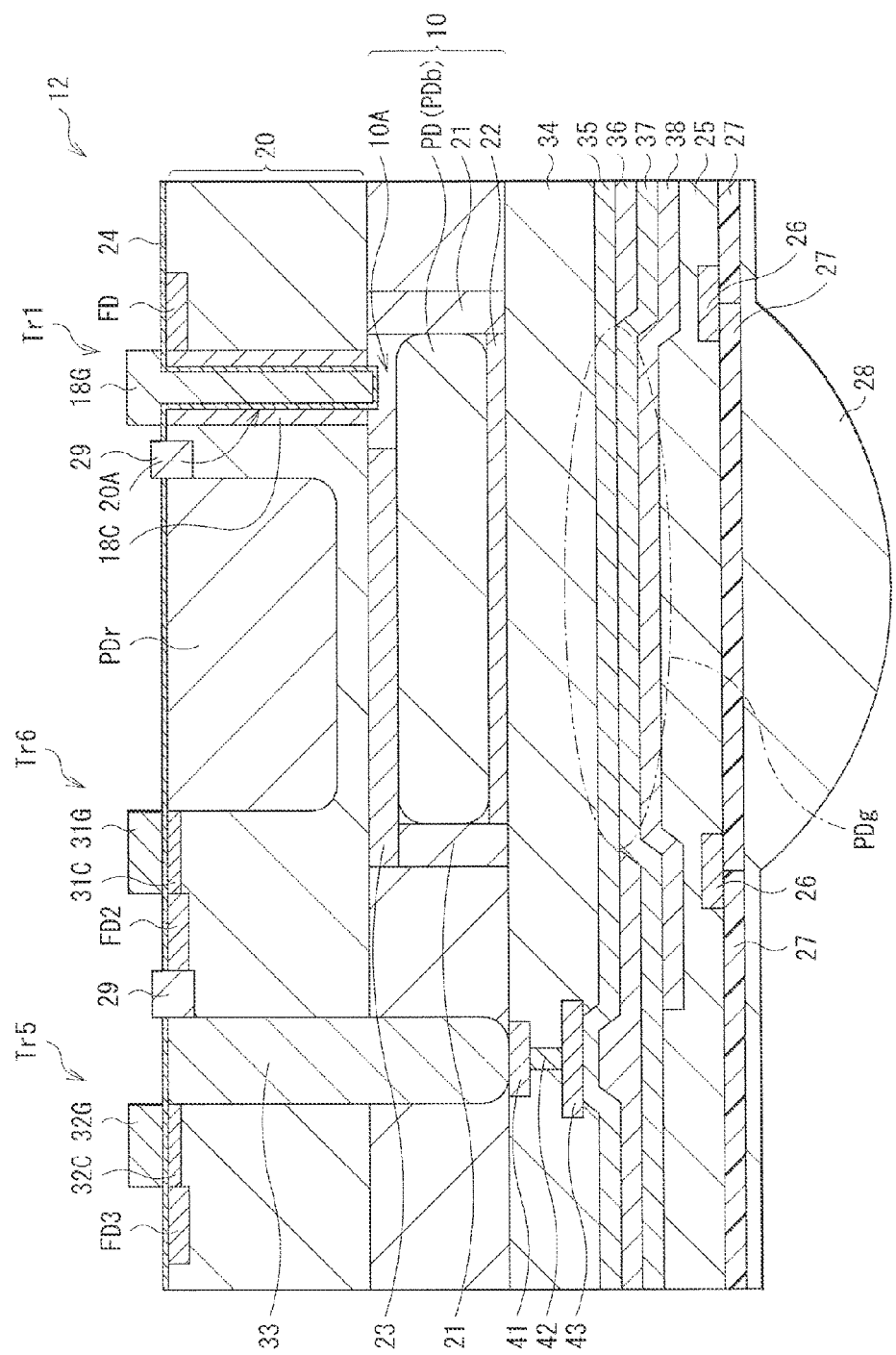
FIG. 30 is a diagram illustrating an example of a cross-sectional configuration of another pixel according to the third modification.
Figure 31:
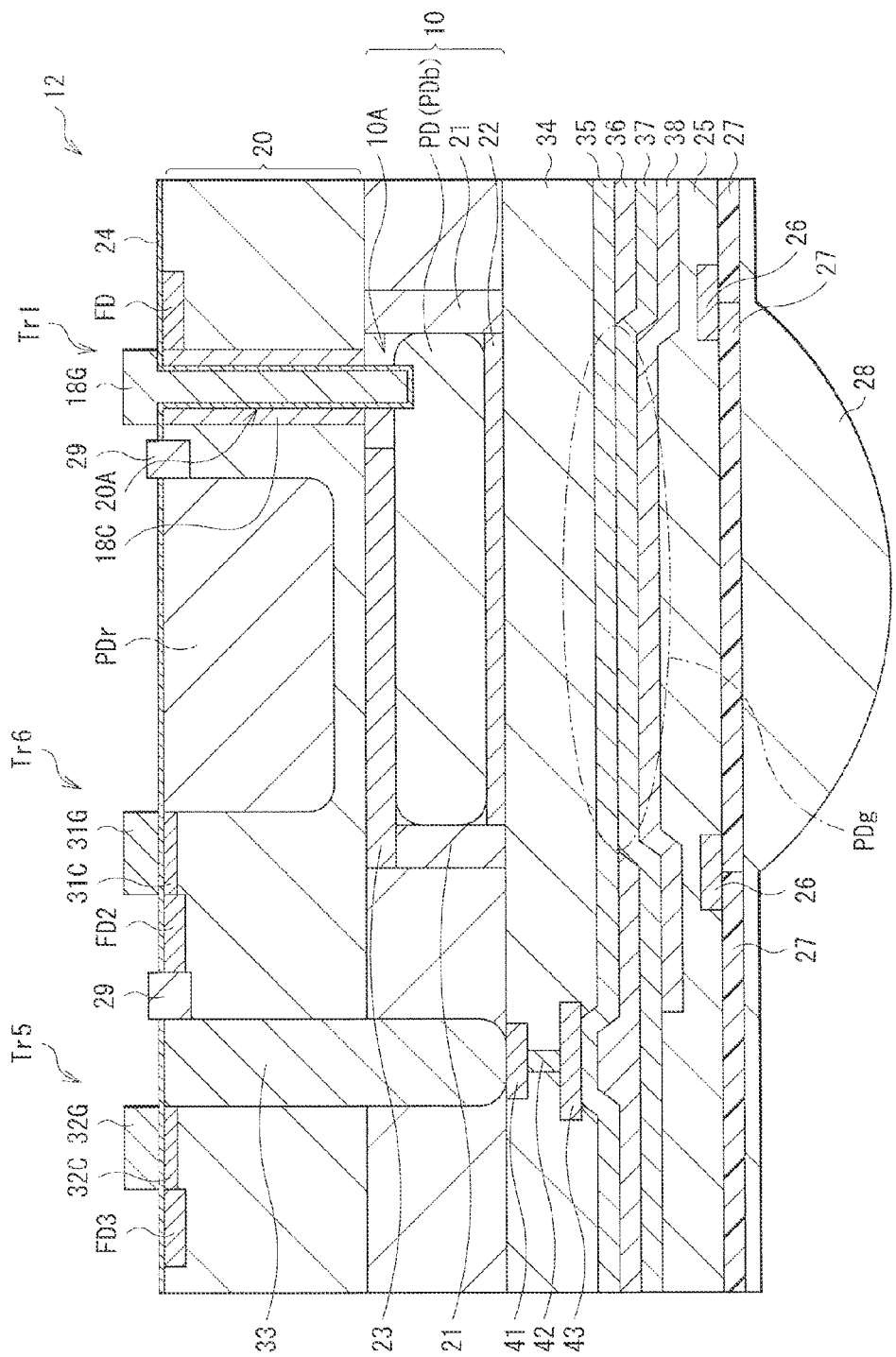
FIG. 31 is a diagram illustrating an example of a cross-sectional configuration of another pixel according to the third modification.
Figure 32:
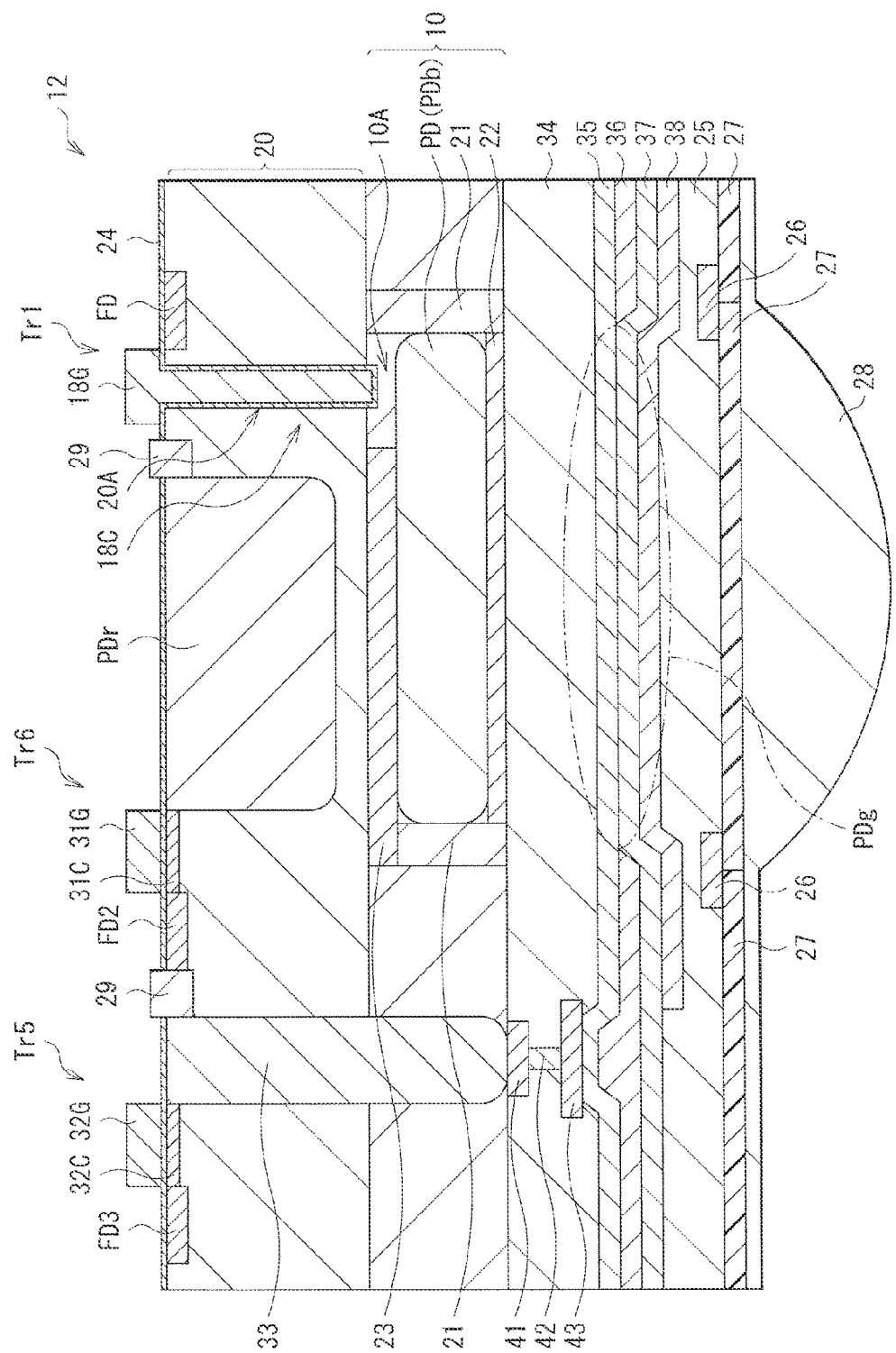
FIG. 32 is a diagram illustrating an example of a cross-sectional configuration of another pixel according to the third modification.
Figure 33:
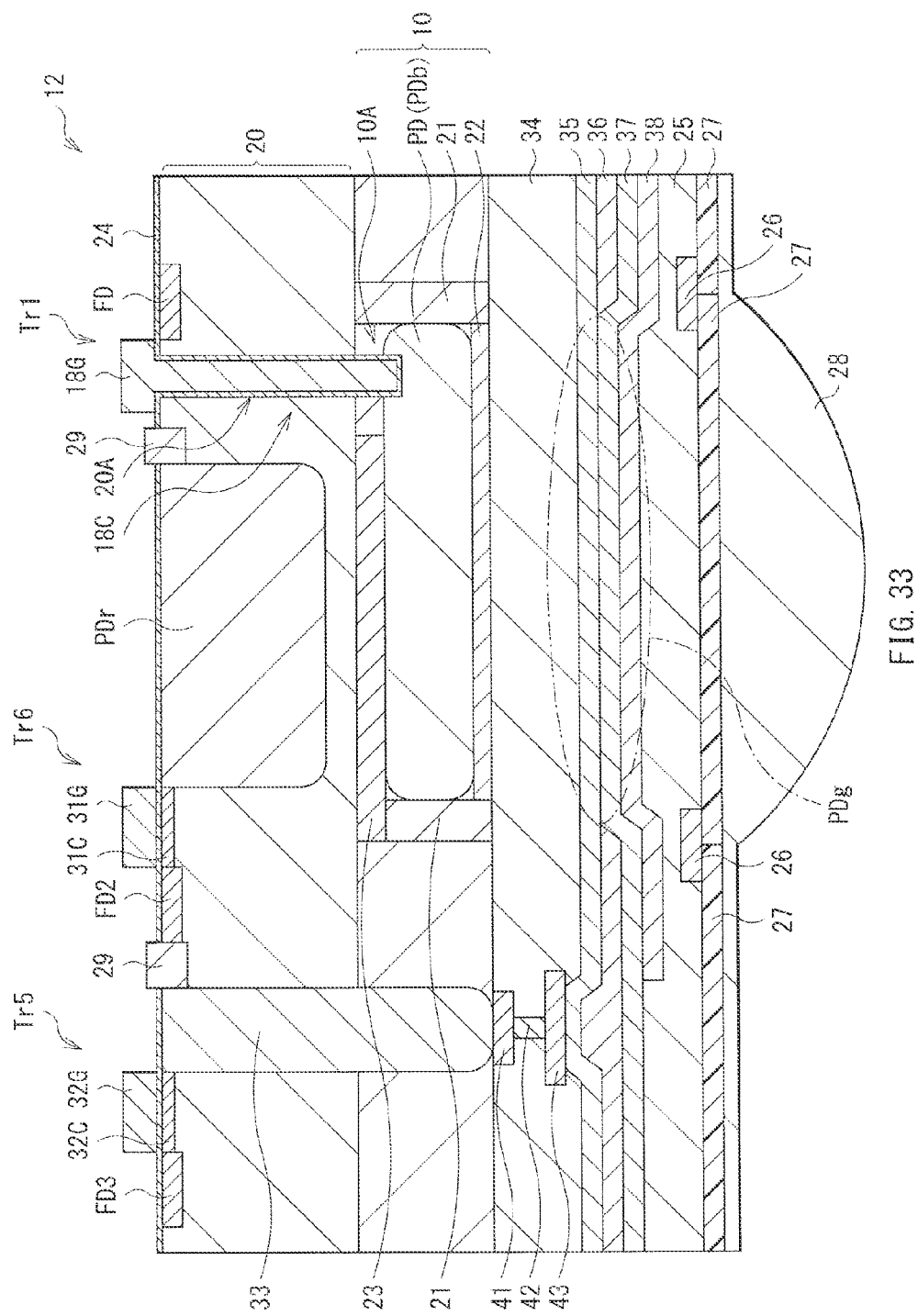
FIG. 33 is a diagram illustrating an example of a cross-sectional configuration of another pixel according to the third modification.

In this case, the channel region 18C has a concentration gradient of the p-type impurity in the thickness direction. Specifically, in the channel region 18C, a concentration of an n-type impurity decreases from the photodiode PD side to the floating diffusion section FD side. Besides, the channel region 18C has concentration distribution in which a curvature of a concentration gradient in the thickness direction is free from a mixture of plus and minus signs. Therefore, as illustrated in FIG. 25, in the channel region 18C, a curvature of a potential gradient is free from a mixture of plus and minus signs, and electric charge accumulation is absent. In other words, the channel region 18C has the concentration gradient in which the curvature of the potential gradient is free from a mixture of plus and minus signs. It is possible to form such a potential gradient, by providing concentration distribution in the thickness direction, in a process of performing the In-Situ Dope epitaxial growth. Therefore, in the present modification as well, it is possible to improve characteristics including a saturated charge amount and sensitivity, as compared with a case in which the photodiode PDb and the transfer transistor Tr1 are provided in the same layer.

5. Third Modification

In the above-described first and second embodiments as well as the modifications (the first modification and the second modification) thereof, an element separation section may be provided between the transfer transistor Tr1 and the pixel transistor Tr, and between the adjacent pixel transistors Tr. For example, as illustrated in FIGS. 26 to 33, an element separation section 29 may be provided between the transfer transistor Tr1 and the pixel transistor Tr, and between the adjacent pixel transistors Tr. The element separation section 29 is provided in the epitaxial layer 20. The element separation section 29 may be, for example, a shallow-trench-isolation (STI) element separation region, provided by filling a trench formed in the epitaxial layer 20, with an insulating film, e.g., a silicon oxide film.

In the present modification, a pn-junction region hardly exists in a part next to the pixel transistor Tr, and between the adjacent pixel transistors Tr. This reduces diffusion-layer capacity, as compared with a case in which the epitaxial layer 20 is present in the part next to the pixel transistor Tr, and between the adjacent pixel transistors Tr. Therefore, it is possible to improve conversion efficiency of the image pickup device 1. As a result, it is possible to improve characteristics including sensitivity.

6. Third Embodiment

Figure 34:
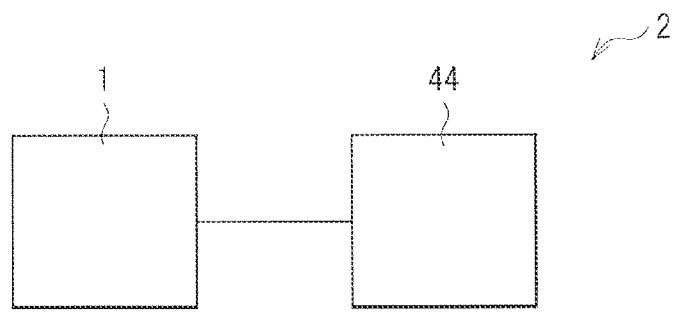
FIG. 34 is a diagram illustrating an example of a schematic configuration of an image pickup module according to a third embodiment of the present technology.

FIG. 34 illustrates a schematic configuration of an image pickup module 2 according to a third embodiment of the present technology. The image pickup module 2 includes the image pickup device 1 according to any of the above-described first and second embodiments as well as the modifications thereof. The image pickup module 2 further includes a signal processing circuit 44 that performs predetermined processing on a pixel signal outputted from the image pickup device 1. For example, the image pickup device 1 and the signal processing circuit 44 may be implemented on a single wiring substrate. The signal processing circuit 44 may be configured of, for example, a digital signal processor (DSP).

In the present embodiment, the image pickup device 1 according to any of the above-described first and second embodiments as well as the modifications thereof is mounted. Therefore, it is possible to provide the image pickup module 2 superior in terms of characteristics including a saturated charge amount and sensitivity.

7. Fourth Embodiment

Figure 35:
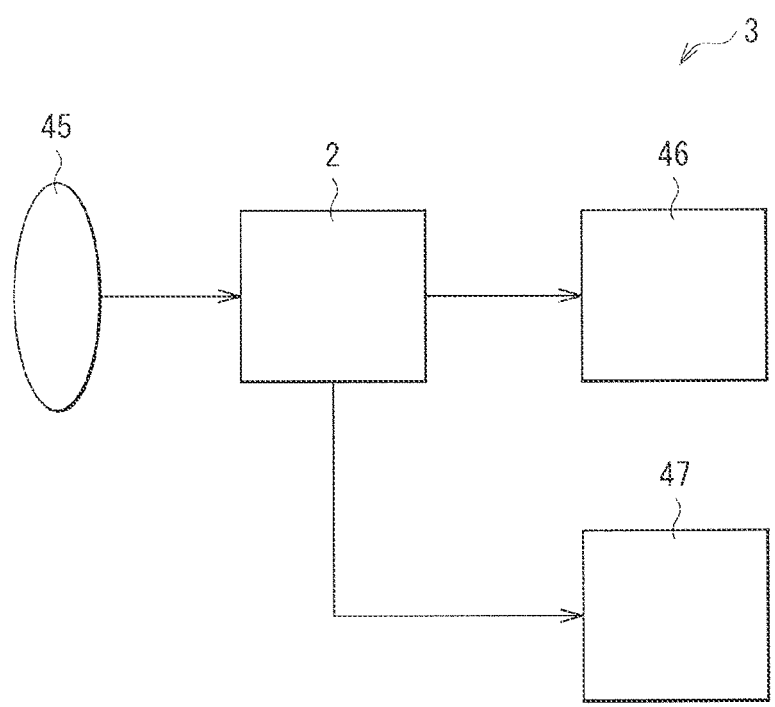
FIG. 35 is a diagram illustrating an example of a schematic configuration of an electronic apparatus according to a fourth embodiment of the present technology.

FIG. 35 illustrates a schematic configuration of an electronic apparatus 3 according to a fourth embodiment of the present technology. The electronic apparatus 3 includes the image pickup module 2 according to the above-described third embodiment. The electronic apparatus 3 further includes a lens 45, a display 46, and a memory unit 47. The lens 45 allows outside light to enter the image pickup device 1. The display 46 displays output of the image pickup module 2, as an image. The memory unit 47 stores the output of the image pickup module 2. It is to be noted that the electronic apparatus 3 may not necessarily include the memory unit 47. In this case, the electronic apparatus 3 may include a write unit that writes information in an external memory unit.

In the present embodiment, the image pickup module 2 according to the above-described third embodiment is mounted. Therefore, it is possible to provide the electronic apparatus 3 superior in terms of characteristics including a saturated charge amount and sensitivity.

The present technology has been described above with reference to some embodiments and modifications thereof, but is not limited thereto and may be variously modified.

It is possible to achieve at least the following configurations from the above-described example embodiments of the disclosure.

(1) An image pickup device including:
    a photodiode provided in a silicon substrate, and configured to generate electric charge corresponding to an amount of received light, by performing photoelectric conversion; and
    a transfer transistor provided at an epitaxial layer on the silicon substrate, and configured to transfer the electric charge generated in the photodiode,
    wherein the transfer transistor includes a gate electrode and a channel region, the gate electrode being embedded in the epitaxial layer, and the channel region surrounding the gate electrode, and
    the channel region has, in a thickness direction, a concentration gradient in which a curvature of a potential gradient is free from a mixture of plus and minus signs.

(2) The image pickup device according to (1), wherein the channel region is formed by providing concentration distribution in the thickness direction, in a process of performing In-Situ Dope epitaxial growth.

(3) The image pickup device according to (1) or (2), wherein the channel region has concentration distribution in which a curvature of a concentration gradient in the thickness direction is free from a mixture of plus and minus signs.

(4) The image pickup device according to any one of (1) to (3), wherein
    the channel region is of one conductivity type in the thickness direction, and
    the channel region is a single layer.

(5) The image pickup device according to any one of (1) to (4), wherein
    the epitaxial layer includes a trench passing through the epitaxial layer,
    the gate electrode is formed to fill the trench, and
    the channel region is formed on a side face of the trench and a part in proximity to the side face.

(6) The image pickup device according to (5), wherein
    the silicon substrate includes an impurity region provided in a part of the silicon substrate, the part being immediately above the photodiode, and the impurity region having a concentration lower than an impurity concentration of the photodiode, and
    a base of the trench is in contact with the impurity region.

(7) An electronic apparatus including:
    an image pickup device; and
    a signal processing circuit configured to perform predetermined processing on a pixel signal outputted from the image pickup device,
    wherein the image pickup device includes
    a photodiode provided in a silicon substrate, and configured to generate electric charge corresponding to an amount of received light, by performing photoelectric conversion, and
    a transfer transistor provided at an epitaxial layer on the silicon substrate, and configured to transfer the electric charge generated in the photodiode,
    the transfer transistor includes a gate electrode and a channel region, the gate electrode being embedded in the epitaxial layer, and the channel region surrounding the gate electrode, and
    the channel region has, in a thickness direction, a concentration gradient in which a curvature of a potential gradient is free from a mixture of plus and minus signs.

(8) A method of manufacturing an image pickup device, the method including:
    forming an epitaxial layer on a top surface of a silicon substrate by performing In-Situ Dope epitaxial growth, the epitaxial layer having concentration distribution in which a curvature of a concentration gradient in a thickness direction is free from a mixture of plus and minus signs, and the silicon substrate including a photodiode that is configured to generate electric charge corresponding to an amount of received light, by performing photoelectric conversion; and
    forming a channel region in a part of the epitaxial layer by inverting a part of the epitaxial layer, the channel region having, in a thickness direction, a concentration gradient in which a curvature of a potential gradient is free from a mixture of plus and minus signs, and the part being immediately above the photodiode.

(9) The method of manufacturing the image pickup device according to (8), wherein the channel region has concentration distribution in which a curvature of a concentration gradient in the thickness direction is free from a mixture of plus and minus signs.

(10) The method of manufacturing the image pickup device according to (8) or (9), wherein
    the channel region is of one conductivity type in the thickness direction, and
    the channel region is a single layer.

It should be understood by those skilled in the art that various modifications, combinations, sub-combinations, and alterations may occur depending on design requirements and other factors insofar as they are within the scope of the appended claims or the equivalents thereof.

What is claimed is:

1. An image pickup device comprising:
    a photodiode provided in a silicon substrate, and configured to generate electric charge corresponding to an amount of received light, by performing photoelectric conversion; and
    a transfer transistor provided at an epitaxial layer on the silicon substrate, and configured to transfer the electric charge generated in the photodiode,
    wherein the transfer transistor includes a gate electrode and a channel region, the gate electrode being embedded in the epitaxial layer, and the channel region surrounding the gate electrode, and the channel region has, in a thickness direction, a concentration gradient in which a curvature of a potential gradient is free from a mixture of plus and minus signs.

2. The image pickup device according to claim 1, wherein the channel region is formed by providing concentration distribution in the thickness direction, in a process of performing In-Situ Dope epitaxial growth.

3. The image pickup device according to claim 2, wherein the channel region has a a concentration distribution in which a curvature of a concentration gradient in the thickness direction is free from a mixture of plus and minus signs.

4. The image pickup device according to claim 3, wherein the channel region is of one conductivity type in the thickness direction, and the channel region is a single layer.

5. The image pickup device according to claim 4, wherein the epitaxial layer includes a trench passing through the epitaxial layer, the gate electrode is formed to fill the trench, and the channel region is formed on a side face of the trench and a part in proximity to the side face.

6. The image pickup device according to claim 5, wherein the silicon substrate includes an impurity region provided in a part of the silicon substrate, the part being immediately above the photodiode, and the impurity region having a concentration lower than an impurity concentration of the photodiode, and a base of the trench is in contact with the impurity region.

7. An electronic apparatus comprising:

an image pickup device; and a signal processing circuit configured to perform predetermined processing on a pixel signal outputted from the image pickup device, wherein the image pickup device includes a photodiode provided in a silicon substrate, and configured to generate electric charge corresponding to an amount of received light, by performing photoelectric conversion, and a transfer transistor provided at an epitaxial layer on the silicon substrate, and configured to transfer the electric charge generated in the photodiode, the transfer transistor includes a gate electrode and a channel region, the gate electrode being embedded in the epitaxial layer, and the channel region surrounding the gate electrode, and the channel region has, in a thickness direction, a concentration gradient in which a curvature of a potential gradient is free from a mixture of plus and minus signs.

* * * * *